(12) United States Patent
Kim et al.

(10) Patent No.: US 12,315,437 B2
(45) Date of Patent: May 27, 2025

(54) DISPLAY DEVICE AND METHOD FOR MANUFACTURING THEREOF

(71) Applicant: Samsung Display Co., LTD., Yongin-si (KR)

(72) Inventors: Wan Jung Kim, Yongin-si (KR); Dae Sang Yun, Yongin-si (KR); Kyung Ah Nam, Yongin-si (KR); Hyo Young Mun, Yongin-si (KR); Yong Seung Park, Yongin-si (KR); Yi Seul Um, Yongin-si (KR); So Young Lee, Yongin-si (KR); Young Hoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/351,312

(22) Filed: Jul. 12, 2023

(65) Prior Publication Data

US 2024/0096273 A1     Mar. 21, 2024

(30) Foreign Application Priority Data

Sep. 16, 2022    (KR) .......................... 10-2022-0117439

(51) Int. Cl.
    *G09G 3/3208*      (2016.01)
(52) U.S. Cl.
    CPC .................. *G09G 3/3208* (2013.01)
(58) Field of Classification Search
    CPC ... G09G 2300/0426; G09G 2300/0408; G09G 2300/0452; G09G 2300/026;
(Continued)

(56) References Cited

U.S. PATENT DOCUMENTS

2019/0378889 A1* 12/2019 Choi ................... H10K 59/131
2020/0185647 A1* 6/2020 Lee ........................ G09G 3/3283
(Continued)

FOREIGN PATENT DOCUMENTS

CN      108623180 A      10/2018
CN      117082921 A      11/2023
(Continued)

OTHER PUBLICATIONS

European Search Report for EP Application No. 23197042.7 dated Jan. 22, 2024, 10 pages.

*Primary Examiner* — Dong Hui Liang
(74) *Attorney, Agent, or Firm* — Womble Bond Dickinson (US) LLP

(57) ABSTRACT

A display device includes: a substrate including a display area and a non-display area surrounding the display area; a light emitting element layer on the display area on the substrate and including a plurality of light emitting elements; and an encapsulating layer on the light emitting element layer and on a portion of the display area and the non-display area; and wherein the substrate comprises an upper surface on which the light emitting element layer is located, a bottom surface opposite to the upper surface, a side surface connected to the upper surface and not parallel to the upper surface, and a first inclined surface connected to the side surface and the bottom surface and not parallel to the side surface and the bottom surface, wherein an edge area of the upper surface of the substrate adjacent to an edge of the substrate, in which a processing trace remains.

14 Claims, 29 Drawing Sheets

(58) Field of Classification Search
CPC .. G09G 2300/08; G09G 2300/04; G09G 3/20;
G09G 3/32; G09G 3/3648; G09G 3/035;
G09G 3/3225; G09G 3/3233; G09G
3/3208; G09G 3/3266; G09G 3/344;
G09G 3/3611; G09G 2310/0267; G09G
2310/0281; G09G 2310/0275; G09G
2320/0233; G09G 2320/0626; G09G
2380/02; G09G 2380/14; G09G 2330/021
See application file for complete search history.

(56) References Cited

U.S. PATENT DOCUMENTS

| | | | |
|---|---|---|---|
| 2020/0403189 A1* | 12/2020 | Lee | H10K 59/1201 |
| 2022/0367776 A1* | 11/2022 | Kung | G09G 3/32 |
| 2023/0371346 A1 | 11/2023 | Yun et al. | |
| 2024/0040830 A1 | 2/2024 | Yun et al. | |

FOREIGN PATENT DOCUMENTS

| | | | |
|---|---|---|---|
| CN | 117460299 A | | 1/2024 |
| EP | 3968402 A1 | | 3/2022 |
| EP | 4291006 A2 | | 12/2023 |
| KR | 10-2020-0145881 A | | 12/2020 |
| KR | 20230160664 A | | 11/2023 |
| KR | 20240015219 A | | 2/2024 |

* cited by examiner

DISPLAY DEVICE AND METHOD FOR MANUFACTURING THEREOF

CROSS-REFERENCE TO RELATED APPLICATION

The present application claims priority to and the benefit of Korean Patent Application No. 10-2022-0117439 filed on Sep. 16, 2022 in the Korean Intellectual Property Office, the entire content of which is incorporated herein by reference.

BACKGROUND

1. Field

Aspects of some embodiments of the present disclosure relate to a display device and a method for manufacturing thereof.

2. Description of the Related Art

As the information society develops, the demand for display devices for displaying images is increasing in various forms. For example, display devices may be utilized in various electronic devices such as smart phones, digital cameras, notebook computers, navigation systems, and smart televisions, among various other electronic devices. Display devices may be flat panel display devices such as liquid crystal display devices, field emission display devices, or organic light emitting display devices. Among the flat panel display devices, the light emitting display device includes a light emitting element in which each pixel of the display panel may emit light by itself, so that images may be displayed without a backlight unit providing light to the display panel.

The display device includes a display area for displaying images and a periphery of the display area, for example, a non-display area arranged to surround the display area. Recently, the width of the non-display area is gradually decreasing to increase immersion in the display area and increase the aesthetics of the display device.

Meanwhile, the display device may be formed by cutting a mother substrate along a plurality of display cells formed on the mother substrate including the plurality of display cells in a manufacturing process of the display device.

The non-display area may include a first non-display area in which lines and circuits for driving the display area are located, and a second non-display area corresponding to a margin for a cutting process in the manufacturing process. Because there is a limit to reducing lines and circuits in the first non-display area, a method for reducing the width of the second non-display area is being studied.

The above information disclosed in this Background section is only for enhancement of understanding of the background and therefore the information discussed in this Background section does not necessarily constitute prior art.

SUMMARY

Aspects and characteristics of some embodiments of the present disclosure may include a display device capable of minimizing or reducing a width of a non-display area and a method of manufacturing the same.

Aspects and characteristics of some embodiments of the present disclosure may include a display device capable of improving mechanical strength of the display device and a method of manufacturing the same.

Aspects and characteristics of embodiments of the present disclosure may include a display device capable of cutting the substrate while reducing the thickness of the substrate and a method of manufacturing the same.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, a display device comprising: a substrate including a display area and a non-display area surrounding the display area, a light emitting element layer on the display area on the substrate and including a plurality of light emitting elements, and an encapsulating layer on the light emitting element layer and on a portion of the display area and the non-display area, and wherein the substrate comprises an upper surface on which the light emitting element layer is located, a bottom surface opposite to the upper surface, a side surface connected to the upper surface and not parallel to the upper surface, and a first inclined surface connected to the side surface and the bottom surface and not parallel to the side surface and the bottom surface, wherein an edge area of the upper surface of the substrate adjacent to an edge of the substrate, in which a processing trace remains.

According to some embodiments, a width of the edge area may be about 50 μm.

According to some embodiments, the first inclined surface may overlap the edge area in a thickness direction.

According to some embodiments, the display device may further comprise a first dam in the non-display area and surrounding the light emitting element layer, a second dam surrounding the first dam and closer to an edge of the substrate than the first dam, wherein the encapsulating layer may cover the first dam.

According to some embodiments, at least a portion of the encapsulating layer may cover the second dam.

According to some embodiments, the encapsulating layer may cover the second dam so that a portion thereof is between the second dam and the edge of the substrate, and wherein a distance between the edge of the substrate and the encapsulating layer may be 300 μm or less.

According to some embodiments, the encapsulating layer may comprise a first encapsulating inorganic layer, an encapsulating organic layer on the first encapsulating inorganic layer, and a second encapsulating inorganic layer on the encapsulating organic layer, wherein at least a portion of the encapsulating inorganic layer and the second encapsulating inorganic layer may be in the non-display area.

According to some embodiments, the display device may further comprise a crack dam in the non-display area on the substrate and surrounding the display area.

According to some embodiments, the first encapsulating inorganic layer and the second encapsulating inorganic layer of the encapsulating layer may cover the crack dam and extended to the edge area of the substrate.

According to some embodiments, a distance between the crack dam and the edge area may be 130 μm or less.

According to some embodiments, the display device may further comprise a heat dissipation layer on the substrate to overlap the crack dam.

According to some embodiments, the heat dissipation layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

According to some embodiments, the display device may further comprise a protective layer on the side surface of the substrate and the first inclined surface.

According to some embodiments, an angle between the upper surface and the side surface of the substrate may be about 90°, an angle formed between the side surface and the first inclined surface, and an angle formed between the first inclined surface and the bottom surface may be obtuse angles, respectively.

According to some embodiments of the disclosure, a method for manufacturing a display device comprising: preparing a mother substrate and forming a plurality of display cells on one surface of the mother substrate, forming a cutting line along the periphery of the display cell by irradiating a laser from the other surface opposite to the one surface of the mother substrate, and separating the substrate on which the display cells are formed by etching the mother substrate along the other surface and the cutting line, forming a processing mark on the one surface of the substrate in the processing of irradiating the laser.

According to some embodiments, the laser may be a Bessel beam having an infrared wavelength.

According to some embodiments, the laser may be irradiated from the one surface of the mother substrate to a first depth, and the first depth has a depth in a range of 50 μm to 500 μm from the one surface.

According to some embodiments, the etching of the mother substrate may comprise reducing a thickness of the mother substrate by isotropically etching the other surface of the mother substrate, and separating the substrate by anisotropically etching the cut line and areas other than the cut line irradiated with the laser on the mother substrate.

According to some embodiments, the substrate may comprise a side surface connected to the one surface and not parallel to the one surface, and a first inclined surface connected to the side surface and the other surface and is not parallel to the side surface and the other surface, wherein the substrate may include an edge area in which the processing trace is formed.

According to some embodiments, a width of the edge area may be about 50 μm.

The display device according to some embodiments may minimize or reduce an area that unnecessarily occupies space in the outer part of the display panel.

The method of manufacturing the display device according to some embodiments may include a process of irradiating a laser and an etching process, thereby improving the efficiency of the manufacturing process.

The characteristics of embodiments according to the present disclosure are not limited to the aforementioned characteristics, and various other effects are included in the present specification.

DETAILED DESCRIPTION

Aspects of some embodiments of the present invention will now be described more fully hereinafter with reference to the accompanying drawings, in which some embodiments of the invention are shown. Embodiments according to the present invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Hereinafter, aspects of some embodiments will be described in more detail with reference to the accompanying drawings.

Figure 1:
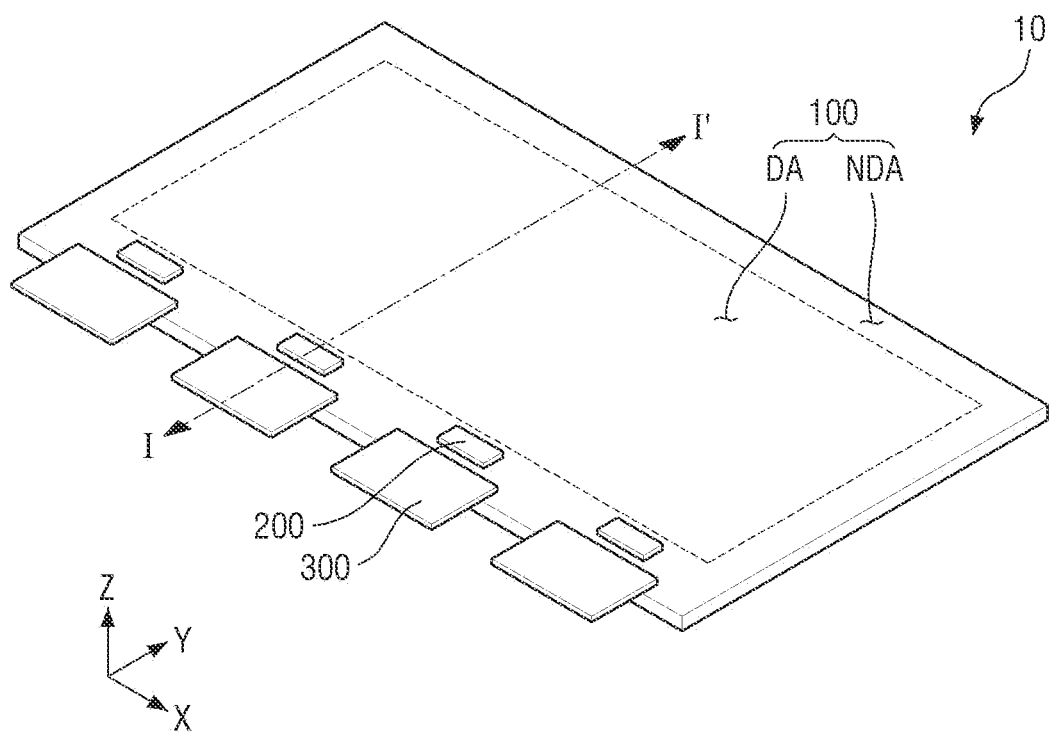
FIG. 1 is a schematic perspective view of a display device according to some embodiments.
Figure 2:
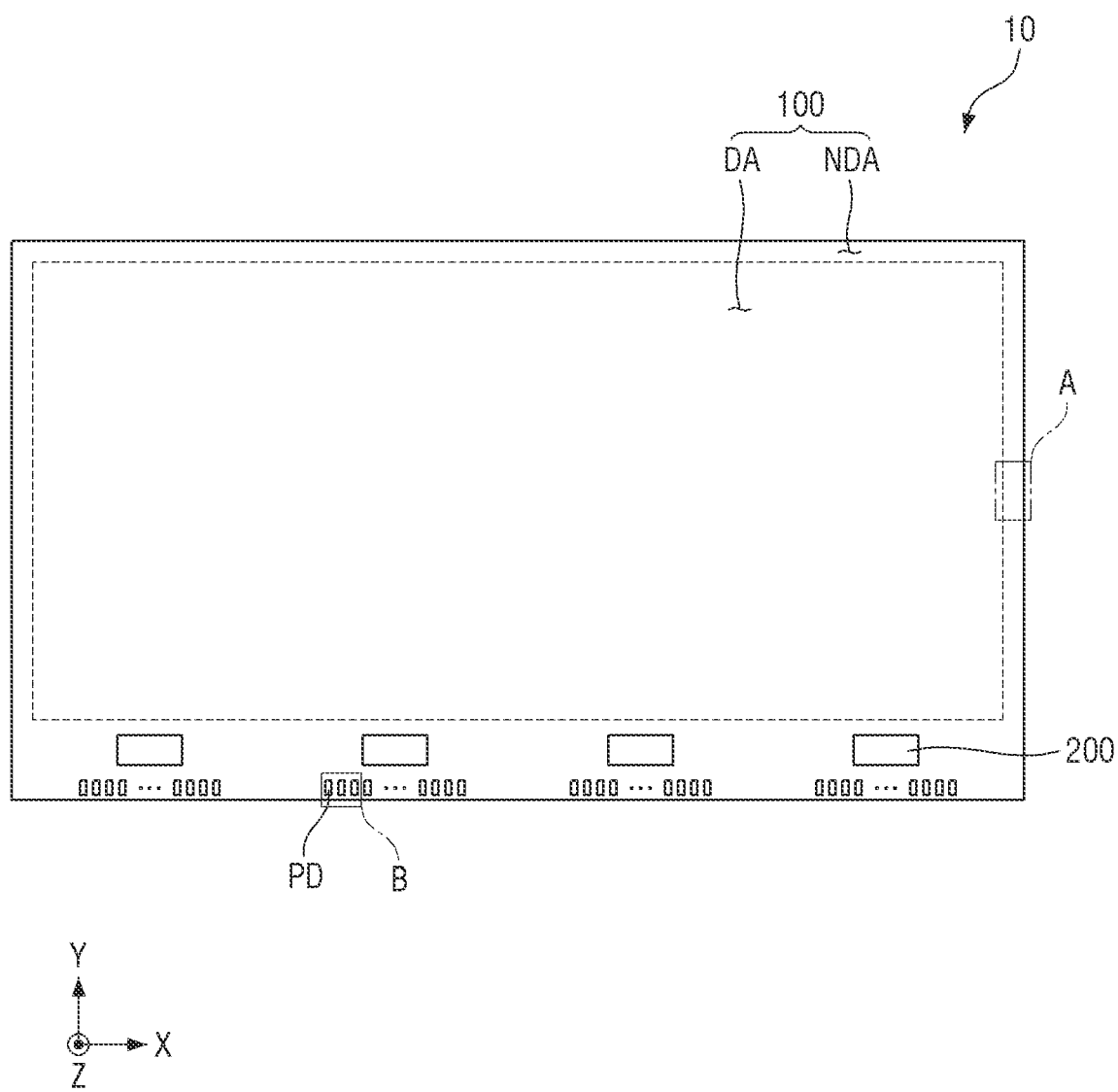
FIG. 2 is a plan view illustrating a display panel according to some embodiments.

FIG. 1 is a perspective view illustrating a display device according to some embodiments. FIG. 2 is a plan view illustrating a display panel according to some embodiments.

Referring to FIGS. 1 and 2, a display device 10 is a device for displaying a moving image or a still image. The display device may be used as a display screen of various products such as televisions, laptop computers, monitors, billboards, and Internet of Things (IOT) devices as well as portable electronic devices such as mobile phones, smart phones, tablet personal computer (tablet PC), smart watches, watch phones, mobile communication terminals, electronic notebooks, electronic books, portable multimedia players (PMP), navigation systems and ultra mobile PCs (UMPC).

The display device 10 according to some embodiments may be a light emitting display device such as an organic light emitting display device using an organic light emitting diode, a quantum dot light emitting display including a quantum dot light emitting layer, an inorganic light emitting display device including an inorganic semiconductor, and a micro light emitting display device using a micro or nano light emitting diode (micro LED or nano LED). Hereinafter, the display device 10 has been mainly described as an organic light emitting display device, but embodiments according to the present disclosure are not limited thereto.

The display device 10 according to some embodiments includes a display panel 100, a driving integrated circuit (IC) 200, and a circuit board 300.

The display panel 100 may be formed in a rectangular plane having a long side in a first direction (X-axis direction) and a short side in a second direction (Y-axis direction) intersecting the first direction (X-axis direction). A corner where the long side of the first direction (X-axis direction) and the short side of the second direction (Y-axis direction) meet may be formed at a right angle or rounded to have a curvature. The flat shape of the display panel 100 is not limited to a quadrangle, and may be formed in other polygons, circles, or ovals.

The display panel 100 may be formed to be flat but is not limited thereto. For example, the display panel 100 is formed at left and right ends and may include curved parts having a constant curvature or a varying curvature. In addition, the display panel 100 may be flexibly formed to be bent, folded, or rolled.

The display panel 100 may include a display area DA displaying images and a non-display area NDA arranged around (e.g., in a periphery or outside a footprint) of the display area DA.

The display area DA may occupy most of the area of the display panel 100. The display area DA may be located in the center of the display panel 100. Pixels each including a plurality of emission areas may be located in the display area DA to display an image.

The non-display area NDA may be located adjacent to the display area DA. The non-display area NDA may be an area outside the display area DA. The non-display area NDA may be arranged to surround the display area DA. The non-display area NDA may be an edge area of the display panel 100.

Display pads DP may be located in the non-display area NDA to be connected to the circuit boards 300. The display pads DP may be located on one edge of the display panel 100. For example, the display pads DP may be located on the bottom edge of the display panel 100.

The driving integrated circuits IC 200 may generate data voltages, power supply voltages, scan timing signals, and the like. The driving ICs 200 may output data voltages, power supply voltages, scan timing signals, and the like.

The driving IC 200 may be located between the display pads PD and the display area DA in the non-display area NDA. Each of the driving ICs 200 may be attached to the non-display area NDA of the display panel 100 in a chip on glass (COG) method. Alternatively, each of the driving ICs 200 may be attached to the circuit board 300 using a chip on plastic (COP) method.

The circuit boards 300 may be located on the display pads DP located on one edge of the display panel 100. The circuit boards 300 may be attached to the display pads PD using an anisotropic conductive film and a conductive adhesive member such as an anisotropic conductive adhesive. Accordingly, the circuit boards 300 may be electrically connected to signal lines of the display panel 100. The circuit boards 300 may be a flexible film such as a flexible printed circuit board or a chip on film.

Figure 3:
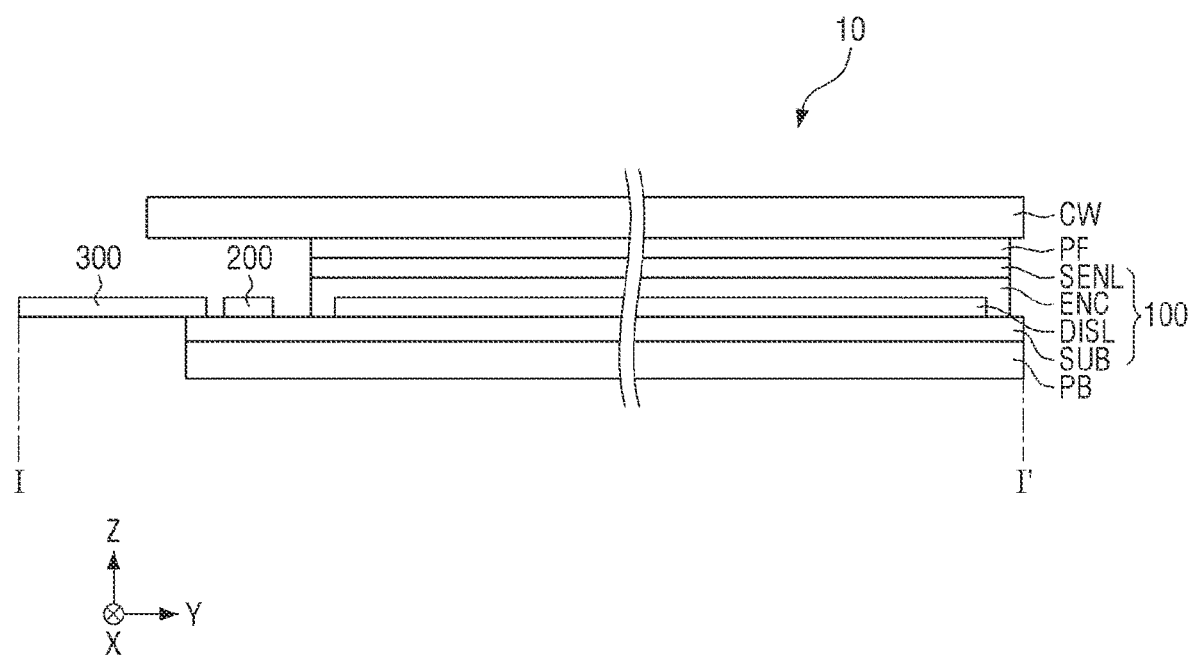
FIG. 3 is a cross-sectional view illustrating an example of a display device taken along the line I-I' of FIG. 1 according to some embodiments.
Figure 4:
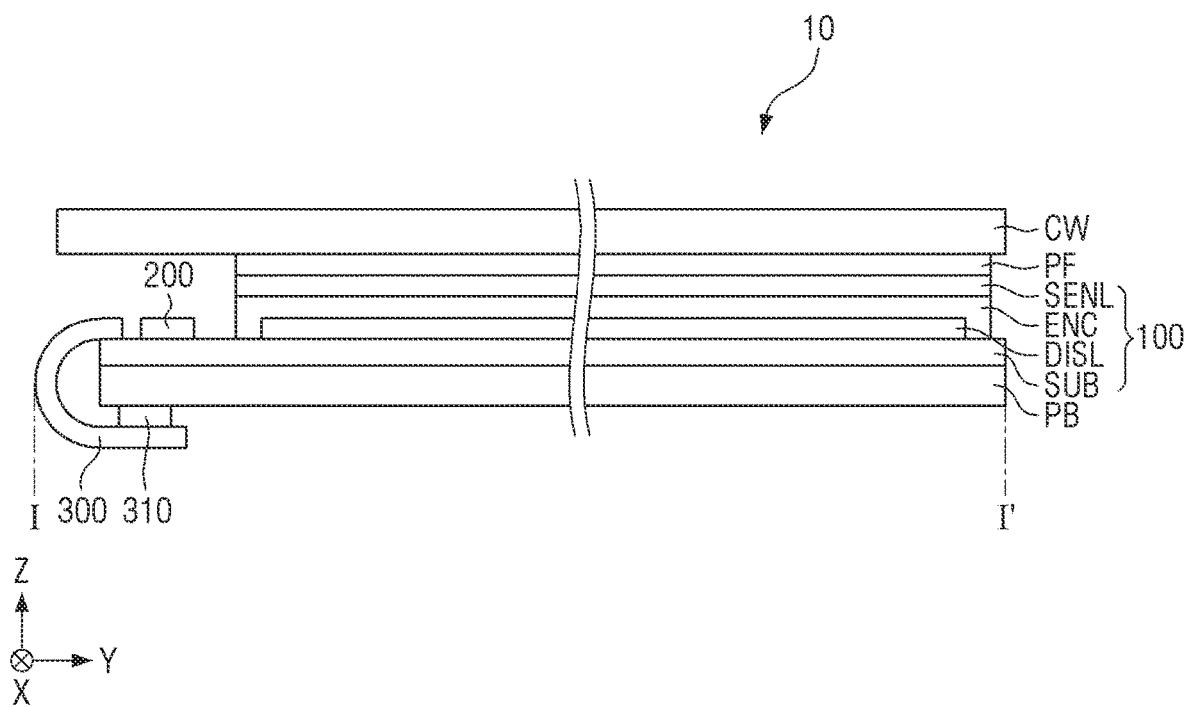
FIG. 4 is a cross-sectional view illustrating an example of a display device in which the circuit board is bent in FIG. 3 according to some embodiments.

FIG. 3 is a cross-sectional view illustrating an example of a display device taken along the line I-I' of FIG. 1. FIG. 4 is a cross-sectional view illustrating an example of a display device in which the circuit board is bent in FIG. 3.

Referring to FIGS. 3 and 4, the display device 10 according to some embodiments may include the display panel 100, a polarizing film PF, a cover window CW, and a panel bottom cover PB. The display panel 100 may include the substrate SUB, a display layer DISL, an encapsulating layer ENC, and a sensor electrode layer SENL.

The substrate SUB may be formed of glass.

The display layer DISL may be located on the first surface of the substrate SUB. The display layer DISL may be a layer that displays an image. The display layer DISL may include a thin film transistor layer TFTL in which thin film transistors are formed and a light emitting element layer EML in which light emitting elements that emit light are located in the light emitting areas.

In the display area DA of the display layer DISL, scan lines, data lines, power lines, etc. for the emission areas to emit light may be located. In the non-display area NDA of the display layer DISL, a scan driving circuit unit for outputting scan signals to the scan lines, and fan-out lines connecting the data lines and the driving IC 200 may be located.

The encapsulating layer ENC may be a layer for encapsulating the light emitting element layer EML of the display layer DISL to prevent or reduce instances of oxygen, moisture, or other contaminants penetrating into the light emitting element layer EML of the display layer DISL. The encapsulating layer ENC may be located on the display layer DISL. The encapsulating layer ENC may be located on the upper surface and side surfaces of the display layer DISL. The encapsulating layer ENC may be arranged to cover the display layer DISL.

The sensor electrode layer SENL may be located on the display layer DISL. The sensor electrode layer SENL may include sensor electrodes. The sensor electrode layer SENL may sense a user's touch using sensor electrodes.

The polarizing film PF may be located on the display panel 100 to reduce reflection of external light. The polarizing film PF may include a first base member, a linear polarizing plate, a phase delay film such as a $\lambda/4$ plate (quarter-wave plate), and a second base member. The first base member, the phase delay film, the linear polarizing plate, and the second base member of the polarizing film PF may be sequentially stacked on the display panel 100.

The cover window CW may be located on the polarizing film PF. The cover window CW may be attached to the polarizing film PF by a transparent adhesive member such as an optically clear adhesive (OCA) film.

The panel bottom cover PB may be located on the second surface of the substrate SUB of the display panel 100. The second surface of the substrate SUB may be opposite to the first surface. The panel bottom cover PB may be attached to the second surface of the substrate SUB of the display panel 100 through the adhesive member. The adhesive member may be a pressure sensitive adhesive (PSA).

The panel bottom cover PB may include at least one of a light blocking member for absorbing light incident from the outside, a buffer member for absorbing an impact from the outside, or a heat dissipation member for efficiently dissipating heat of the display panel 100.

The light blocking member may be located under the display panel 100. The light blocking member blocks light transmission to prevent or reduce instances of components located under the light blocking member, for example, the display circuit board 300 being viewed from above the display panel 100. The light blocking member may include a light absorbing material such as a black pigment or a black dye.

The buffer member may be located under the light blocking member. The buffer member absorbs an external shock to prevent or reduce instances of the display panel 100 being damaged. The buffer member may be formed of a single layer or a plurality of layers. For example, the buffer member is formed of a polymer resin such as polyurethane, polycarbonate, polypropylene, polyethylene, or the like, or may include a material having elasticity, such as rubber, a urethane-based material, or a sponge formed by foam molding an acrylic-based material.

The heat dissipation member may be located under the buffer member. The heat dissipation member may include a first heat dissipation layer including graphite or carbon nanotubes, and a second heat dissipation layer formed of a thin metal film such as copper, nickel, ferrite, or silver, which may shield electromagnetic waves and has excellent thermal conductivity.

The circuit board 300 may be bent downward of the display panel 100 as shown in FIG. 4. The circuit board 300 may be attached to the bottom surface of the panel bottom cover PB by an adhesive member 310. The adhesive member 310 may be a pressure-sensitive adhesive.

Figure 5:
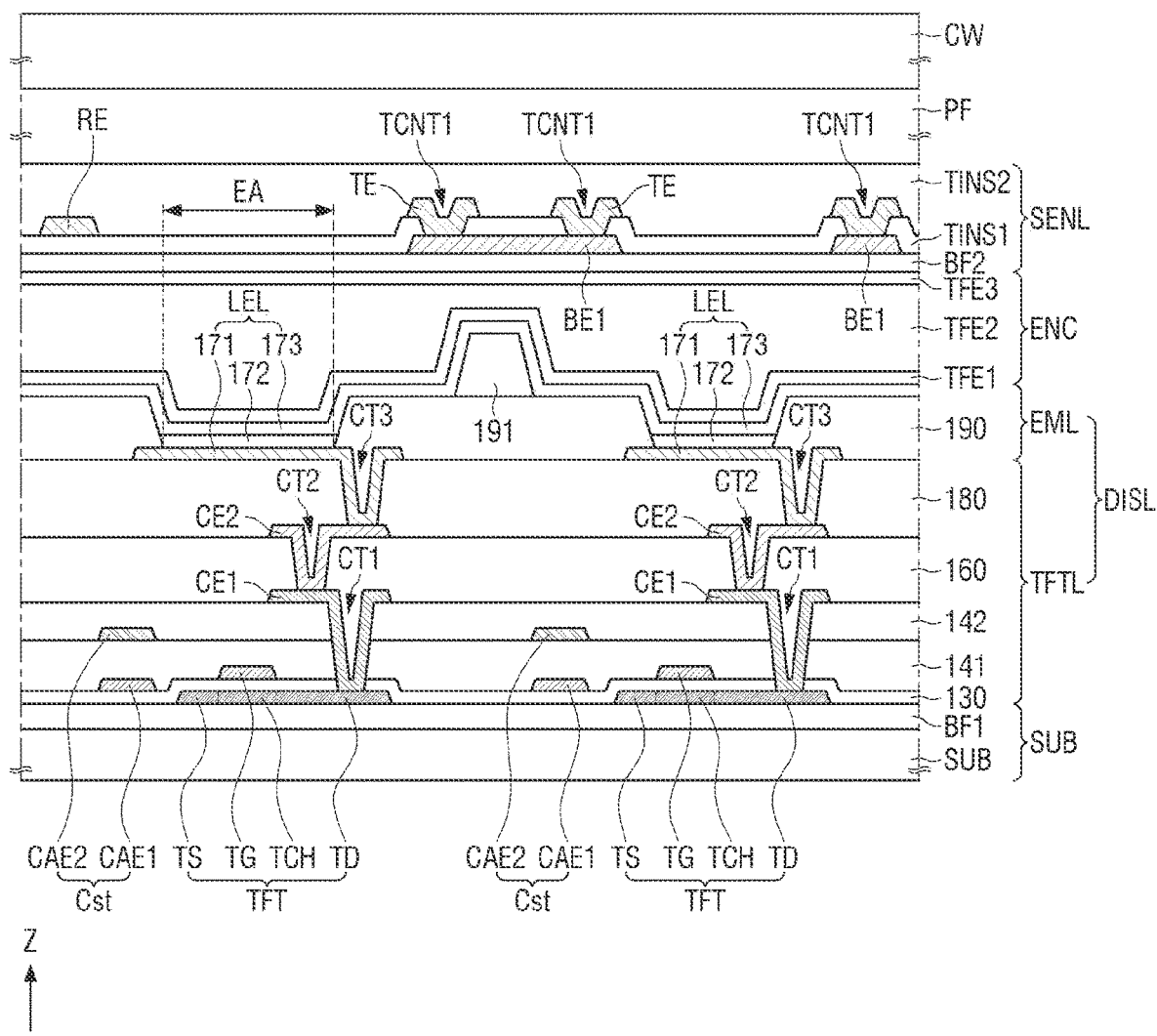
FIG. 5 is a cross-sectional view illustrating an example of a display area of a display panel according to some embodiments.

FIG. 5 is a cross-sectional view illustrating an example of a display area of a display panel according to some embodiments.

Referring to FIG. 5, the display panel 100 according to some embodiments may be an organic light emitting display panel including a light emitting element LEL including an organic light emitting layer 172.

The display layer DISL may include a thin film transistor layer TFTL including a plurality of thin film transistors and a light emitting element layer EML including a plurality of light emitting elements.

A first buffer layer BF1 may be located on the substrate SUB. The first buffer layer BF1 may be formed of an inorganic material such as a silicon nitride layer, a silicon oxynitride layer, a silicon oxide layer, a titanium oxide layer, and an aluminum oxide layer. Alternatively, the first buffer layer BF1 may be formed as a multilayer in which a plurality of layers of a silicon nitride layer, a silicon oxynitride layer, a silicon oxide layer, a titanium oxide layer, and an aluminum oxide layer are alternately stacked.

An active layer including a channel area TCH, a source area TS, and a drain area TD of a thin film transistor TFT may be located on the first buffer layer BF1. The active layer may be formed of polycrystalline silicon, single crystal silicon, low temperature polycrystalline silicon, amorphous silicon, or an oxide semiconductor material. When the active layer includes polycrystalline silicon or an oxide semiconductor material, the source area TS and the drain area TD in the active layer may be conductive areas doped with ions or impurities to have conductivity.

A gate insulating layer 130 may be located on the active layer of the thin film transistor TFT. The gate insulating layer 130 may be formed of an inorganic layer, for example, a silicon nitride layer, a silicon oxynitride layer, a silicon oxide layer, a titanium oxide layer, or an aluminum oxide layer.

A first gate metal layer including a gate electrode TG of the thin film transistor TFT, a first capacitor electrode CAE1 of the capacitor Cst, and scan lines may be located on the gate insulating layer 130. The gate electrode TG of the thin film transistor TFT may overlap the channel area TCH in the third direction (Z-axis direction). The first gate metal layer may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

A first interlayer insulating layer 141 may be located on the first gate metal layer. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may include a plurality of inorganic layers.

A second gate metal layer including a second capacitor electrode CAE2 of the capacitor Cst may be located on the first interlayer insulating layer 141. The second capacitor electrode CAE2 may overlap the first capacitor electrode CAE1 in the third direction (Z-axis direction). Therefore, the capacitor Cst may be formed by the first capacitor electrode CAE1, the second capacitor electrode CAE2, and an inorganic insulating dielectric layer located therebetween and serving as a dielectric layer. The second gate metal layer may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

A second interlayer insulating layer 142 may be located on the second gate metal layer. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may include a plurality of inorganic layers.

A first data metal layer including a first connection electrode CE1 and data lines may be located on the second interlayer insulating layer 142. The first connection electrode CE1 may be connected to the drain area TD through a first contact hole CT1 penetrating the gate insulating layer 130, the first interlayer insulating layer 141, and the second interlayer insulating layer 142. The first data metal layer may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

A first organic layer 160 for flattening a step difference due to a thin film transistors TFT may be located on the first connection electrode CE1. The first organic layer 160 may be formed of an organic layer such as acryl resin, epoxy resin, phenolic resin, polyamide resin, polyimide resin, etc.

A second data metal layer including a second connection electrode CE2 may be located on the first organic layer 160. The second data metal layer may be connected to the first connection electrode CE1 through a second contact hole CT2 penetrating the first organic layer 160. The second data metal layer may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

A second organic layer 180 may be located on the second connection electrode CE2. The second organic layer 180 may be formed of an organic layer such as acryl resin, epoxy resin, phenolic resin, polyamide resin, polyimide resin, etc.

Meanwhile, the second data metal layer and the second organic layer 180 including the second connection electrode CE2 may be omitted.

The light emitting element layer EML is located on the thin film transistor layer TFTL. The light emitting element layer EML may include light emitting elements LEL and a bank 190.

Each of the light emitting elements LEL may include a pixel electrode 171, a light emitting layer 172, and a common electrode 173. Each of the emission areas EA represents an emission area where holes from the pixel electrode 171 and electrons from the common electrode 173 are combined with each other in the light emitting layer 172 to emit light by sequentially stacking the pixel electrode 171, the light emitting layer 172, and the common electrode 173. In this case, the pixel electrode 171 may be an anode electrode, and the common electrode 173 may be a cathode electrode.

A pixel electrode layer including the pixel electrode 171 may be formed on the second organic layer 180. The pixel electrode 171 may be connected to the second connection electrode CE2 through a third contact hole CT3 penetrating the second organic layer 180. The pixel electrode layer may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

In a top emission structure that emits light in the direction of the common electrode 173 based on the light emitting layer 172, the pixel electrode 171 may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/Al/ITO), APC alloy, a stacked structure of APC alloy, and ITO (ITO/APC/ITO) to increase reflectivity. The APC alloy is an alloy of silver (Ag), palladium (Pd), and copper (Cu).

The bank 190 serves to define the emission areas EA of the pixels. To this end, the bank 190 may be formed to expose a partial area of the pixel electrode 171 on the second organic layer 180. The bank 190 may cover the edge of the pixel electrode 171. The bank 190 may be located in the third contact hole CT3. That is, the third contact hole CT3 may be filled by the bank 190. The bank 190 may be formed of an organic layer such as an acrylic resin, an epoxy resin, a phenolic resin, a polyamide resin, or a polyimide resin.

A spacer 191 may be located on the bank 190. The spacer 191 may serve to support a mask during the process of manufacturing a light emitting layer 172. The spacer 191 may be formed of an organic layer such as an acrylic resin, an epoxy resin, a phenolic resin, a polyamide resin, or a polyimide resin.

The light emitting layer 172 is formed on the pixel electrode 171. The light emitting layer 172 may include an organic material to emit a color (e.g., a set or predetermined color). For example, the light emitting layer 172 may include a hole transporting layer, an organic material layer, and an electron transporting layer. The organic material layer may include a host and a dopant. The organic material layer may include a material emitting light (e.g., a set or predetermined light) and may be formed using a phosphorescent material or a fluorescent material.

The common electrode 173 is formed on the light emitting layer 172. The common electrode 173 may be formed to cover the light emitting layer 172. The common electrode 173 may be a common layer commonly formed in the emission areas EA1, EA2, EA3, and EA4. A capping layer may be formed on the common electrode 173.

In the upper light emitting structure, the common electrode 173 may be formed of a transparent conductive material (TCO) such as ITO or IZO that may transmit light, or a semi-transmissive conductive material such as magnesium (Mg), silver (Ag), or an alloy of magnesium (Mg) and silver (Ag). When the common electrode 173 is formed of a transflective metal material, light output efficiency may be increased by a micro cavity.

The encapsulating layer ENC may be formed on the light emitting element layer EML. The encapsulating layer ENC may include at least one inorganic layer TFE1 and TFE2 to prevent or reduce oxygen, moisture, or other contaminants penetrating into the light emitting element layer EML. Also, the encapsulating layer ENC may include at least one organic layer to protect the light emitting element layer EML from foreign substances such as dust. For example, the encapsulating layer ENC may include a first encapsulating inorganic layer TFE1, an encapsulating organic layer TFE2, and a second encapsulating inorganic layer TFE3.

The first encapsulating inorganic layer TFE1 may be located on the common electrode 173, the encapsulating organic layer TFE2 may be located on the first encapsulating inorganic layer TFE1, and the second encapsulating inorganic layer TFE3 may be located on the encapsulation organic layer TFE2. The first encapsulating inorganic layer TFE1 and the second encapsulating inorganic layer TFE3 may be formed as a multilayer in which one or more inorganic layers of a silicon nitride layer, a silicon oxynitride layer, a silicon oxide layer, a titanium oxide layer, and an aluminum oxide layer are alternately stacked. The encapsulating organic layer TFE2 may be an organic film such as an acrylic resin, an epoxy resin, a phenolic resin, a polyamide resin, or a polyimide resin.

The sensor electrode layer SENL is located on the encapsulating layer ENC. The sensor electrode layer SENL may include sensor electrodes TE and RE.

A second buffer layer BF2 may be located on the encapsulating layer ENC. The second buffer layer BF2 may include at least one inorganic layer. For example, the second buffer layer BF2 may be formed as a multilayer in which one or more inorganic layers of a silicon nitride layer, a silicon oxynitride layer, a silicon oxide layer, a titanium oxide layer, and an aluminum oxide layer are alternately stacked. The second buffer layer BF2 may be omitted.

A first connection parts BE1 may be located on the second buffer layer BF2. The first connection parts BE1 may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/Al/ITO), APC alloy, a stacked structure of APC alloy, and ITO (ITO/APC/ITO).

A first sensor insulating layer TINS1 may be located on the first connection parts BE1. The first sensor insulating layer TINS1 may be formed of an inorganic layer, for example, a silicon nitride layer, a silicon oxynitride layer, a silicon oxide layer, a titanium oxide layer, or an aluminum oxide layer.

The sensor electrodes, that is, a driving electrodes TE and sensing electrodes RE, may be located on the first sensor insulating layer TNIS1. In addition, dummy patterns may be located on the first sensor insulating layer TNIS1. The driving electrodes TE, the sensing electrodes RE, and the dummy patterns do not overlap the emission areas EA. The driving electrodes TE, the sensing electrodes RE, and the dummy patterns may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/Al/ITO), APC alloy, a stacked structure of APC alloy, and ITO (ITO/APC/ITO).

A second sensor insulating layer TINS2 may be located on the driving electrodes TE, the sensing electrodes RE, and the dummy patterns. The second sensor insulating layer TINS2 may include at least one of an inorganic layer or an organic layer. The inorganic layer may be a silicon nitride layer, a silicon oxynitride layer, a silicon oxide layer, a titanium oxide layer, or an aluminum oxide layer. The organic layer may be an acrylic resin, an epoxy resin, a phenolic resin, a polyamide resin, or a polyimide resin.

Figure 6:
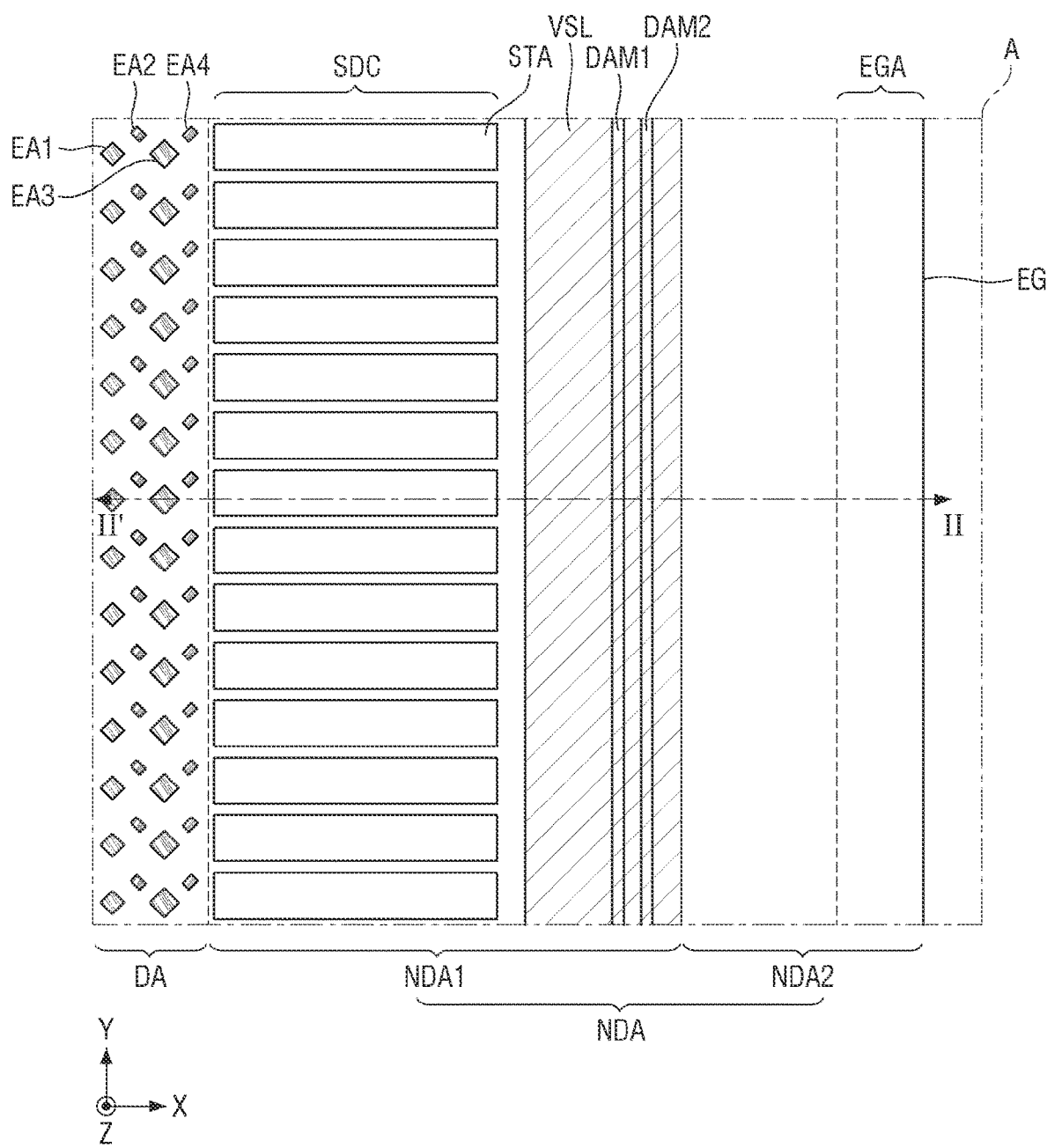
FIG. 6 is a layout diagram illustrating an example of area A of FIG. 2 in more detail according to some embodiments.

FIG. 6 is a layout diagram illustrating an example of area A of FIG. 2 in detail. FIG. 6 is a layout diagram illustrating a display area DA and a non-display area NDA located on the right side of the display panel 100 according to some embodiments.

Referring to FIG. 6, the display area DA may include a plurality of light emitting areas EA1, EA2, EA3, and EA4. The plurality of light emitting areas EA1, EA2, EA3, and EA4 include a first light emitting area EA1 emitting light of a first color, a second light emitting area EA2 and a fourth light emitting area emitting light of a second color, and a third light emitting area EA3 emitting light of a third color. For example, the light of the first color is light in a red wavelength band of approximately 600 nm to 750 nm, the light of the second color is light in a green wavelength band of approximately 480 nm to 560 nm, and the light of the light of third color is light in a blue wavelength band of approximately 370 nm to 460 nm but are not limited thereto.

FIG. 6 illustrates that the second light emitting area EA2 and the fourth light emitting area EA4 emit light of the same color, that is, light of the second color but is not limited thereto. The second light emitting area EA2 and the fourth light emitting area EA4 may emit light of different colors. For example, the second light emitting area EA2 may emit light of a second color, and the fourth light emitting area EA4 may emit light of a fourth color.

FIG. 6 illustrated that each of the first light emitting areas EA1, the second light emitting areas EA2, the third light emitting areas EA3, and the fourth light emitting areas EA4 has a rectangular planar shape but are not limited thereto. Each of the first light emitting areas EA1, the second light emitting areas EA2, the third light emitting areas EA3, and the fourth light emitting areas EA4 may have a polygonal, circular, or elliptical plane other than a quadrangle.

The area of the third light emitting area EA3 may be the largest, and the area of the second light emitting area EA2 and the area of the fourth light emitting area EA4 may be the smallest. The area of the second light emitting area EA2 and the area of the fourth light emitting area EA4 may be the same.

The second light emitting areas EA2 and the fourth light emitting areas EA4 may be alternately arranged in the first direction (X-axis direction). The second light emitting areas EA2 may be arranged in the second direction (Y-axis direction). The fourth light emitting areas EA4 may be arranged in the second direction (Y-axis direction). Each of the fourth light emitting areas EA4 has a long side in a first diagonal direction and a short side in a second diagonal direction, while each of the second light emitting areas EA2 may have a long side in the second diagonal direction DD2 and a short side in the first diagonal direction. The first diagonal direction indicates a diagonal direction between the first direction (X-axis direction) and the second direction (Y-axis direction), and the second diagonal direction may be orthogonal to the first diagonal direction.

The first light emitting areas EA1 and the third light emitting areas EA3 may be alternately arranged in the first direction (X-axis direction). The first light emitting areas EA1 may be arranged in the second direction (Y-axis direction). The third light emitting areas EA3 may be arranged in the second direction (Y-axis direction). Each of the first light emitting areas EA1 and the third light emitting areas EA3 may have a square planar shape but are not limited thereto. In this case, each of the first light emitting areas EA1 and the third light emitting areas EA3 may include two sides parallel to each other in the first diagonal direction and two sides parallel to each other in the second diagonal direction.

The non-display area NDA includes a first non-display area NDA1 and a second non-display area NDA2. The first non-display area NDA1 may be an area in which structures for driving pixels of the display area DA are located. The second non-display area NDA2 may be located outside the first non-display area NDA1. The second non-display area NDA2 may be an edge area of the non-display area NDA. Also, the second non-display area NDA2 may be an edge area of the display panel 100.

A scan driving circuit unit SDC, a first power supply line VSL, a first dam DAM1 and a second dam DAM2 may be located in the first non-display area NDA1.

The scan driving circuit unit SDC may include a plurality of stages STA. The plurality of stages STA may be respectively connected to the scan lines SL of the display area DA extending in the first direction (X-axis direction). That is, the plurality of stages STA may be one-to-one connected to the scan lines of the display area DA extending in the first direction (X-axis direction). The plurality of stages STA may sequentially apply scan signals to the plurality of scan lines.

The first power supply line VSL may be located outside the scan driving circuit unit SDC. That is, the first power supply line VSL may be located closer to an edge EG of the display panel 100 than the scan driving circuit unit SDC. The first power supply line VSL may be extended in the second direction (Y-axis direction) in the non-display area NDA on the left side of the display panel 100.

The first power supply line VSL may be electrically connected to the common electrode 173, so that the common electrode 173 may receive the first power supply voltage from the first power supply line VSL.

The first dam DAM1 and the second dam DAM2 are structures for preventing or reducing instances of the encapsulating organic layer TFE2 of the encapsulating layer ENC overflowing to the edge EG of the display panel 100. The first dam DAM1 and the second dam DAM2 may be extended in the second direction (Y-axis direction) in the non-display area NDA on the left side of the display panel 100. The second dam DAM2 may be located outside the first dam DAM1. The first dam DAM1 may be located closer to the scan driving circuit unit SDC than the second dam DAM2, and the second dam DAM2 may be located closer to the edge EG of the display panel 100 than the first dam DAM1.

FIG. 6 illustrates that the first dam DAM1 and the second dam DAM2 are located on the first power supply line VSL but is not limited thereto. For example, any one of the first dam DAM1 and the second dam DAM2 may not be located on the first power supply line VSL. Alternatively, neither the first dam DAM1 nor the second dam DAM2 may be located on the first power supply line VSL. In this case, the first dam DAM1 and the second dam DAM2 may be located outside the first power supply line VSL1.

FIG. 6 illustrates that the display panel 100 includes two dams DAM1 and DAM2 but is not limited thereto. In some embodiments, the display panel 100 may include three or more dams.

The first power supply line VSL may be a first outer structure located in the first non-display area NDA1. The first outer structure may be located farther away from the edge EG of the display panel 100 than the outermost structure. That is, the distance from the first power supply line VSL, which is the first outer structure, to the edge EG of the display panel 100 may be greater than the distance from the outermost structure to the edge EG of the display panel 100.

The distance from the first supply power supply line VSL to the edge EG of the display panel 100 on the left or right side of the display panel 100 may be smaller than the distance from the first power supply line VSL to the edge EG of the display panel 100 from the upper side of the display panel 100. For example, the distance from the first power supply line VSL to the edge EG of the display panel 100 on the left or right side of the display panel 100 may be about 160 μm or less. Also, the distance from the first power supply line VSL to the edge EG of the display panel 100 on the upper side of the display panel 100 may be about 445 μm or less.

The second dam DAM2 may be a second outer structure located in the first non-display area NDA1. The second outer structure may be located farther away from the edge EG of the display panel 100 than the first outer structure. The distance from the second dam DAM2, which is the second outer structure, to the edge EG of the display panel 100 may be greater than the distance from the first power supply line VSL, which is the first outer structure, to the edge EG of the display panel 100.

The distance from the second dam DAM2 to the edge EG of the display panel 100 on the left or right side of the display panel 100 may be smaller than the distance from the second dam DAM2 to the edge EG of the display panel 100 on the upper side of the display panel 100. For example, the distance from the second dam DAM2 to the edge EG of the display panel 100 on the left side of the display panel 100 may be about 220 μm or less. Also, the distance from the second dam DAM2 to the edge EG of the display panel 100 on the upper side of the display panel 100 may be about 445 μm or less.

The second non-display area NDA2 may include an edge area EGA. The edge area EGA may be arranged along the edge EG of the display panel 100. The edge area EGA may be an area in which machining marks generated in a process of cutting the substrate SUB remain.

Figure 7:
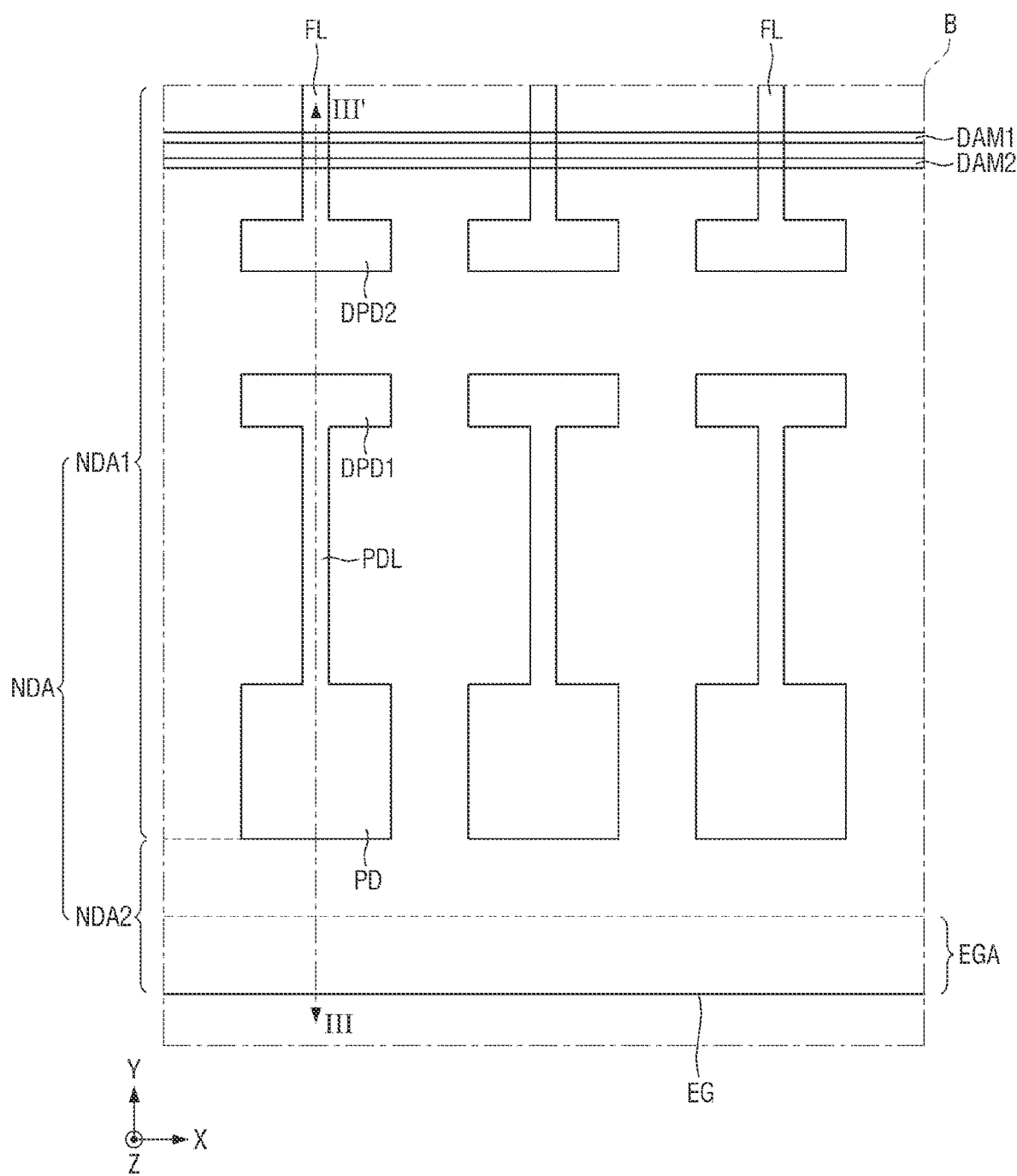
FIG. 7 is a layout diagram illustrating an example of region B of FIG. 2 in more detail according to some embodiments.

FIG. 7 is a layout diagram illustrating an example of area B of FIG. 2 in detail. FIG. 7 is a layout diagram illustrating a non-display area NDA located below the display panel 100 according to some embodiments.

Referring to FIG. 7, the first non-display area NDA1 may be located a plurality of display pads PD, a plurality of first driving pads DPD1, a plurality of second driving pads DPD2, and a plurality of pad lines, a plurality of fan-out lines, the first dam DAM1, and the second dam DAM2.

The plurality of display pads PD may be electrically connected to the circuit board 300 through the conductive adhesive member such as the anisotropic conductive film and the anisotropic conductive adhesive. Each of the plurality of display pads PD may be connected to the pad line PDL. The pad line PDL may connect the display pad PD and a first driving pad DPD1.

The plurality of first driving pads DPD1 and the plurality of second driving pads DPD2 may be electrically connected to the driving IC 200 through the conductive adhesive member such as the anisotropic conductive film and the anisotropic conductive adhesive. The plurality of first driving pads DPD1 may be input pads for the driving IC 200 to receive signals (e.g., digital video data, data timing control signal, etc.) of the circuit board 300. The plurality of second driving pads DPD2 may be output pads for outputting signals (e.g., data voltages) of the driving IC 200. Each of the plurality of second driving pads DPD2 may be connected to the fan-out line FL. The fan-out line FL may connect the second driving pad DPD2 and the data line of the display area DA.

Each of the plurality of first driving pads DPD1 may be located closer to the display area DA in the second direction (Y-axis direction) than the display pad PD connected thereto. That is, among the display pad PD and the first driving pad DPD1 that are connected to each other, the display pad PD may be located closer to the edge EG of the display panel 100 in the second direction (Y-axis direction) than the first driving pad DPD1).

Each of the plurality of second driving pads DPD2 may be located closer to the display area DA in the second direction (Y-axis direction) than any one of the plurality of first driving pads DPD1. That is, the first driving pad DPD1 may be located closer to the edge EG of the display panel 100 in the second direction (Y-axis direction) than any one of the second driving pads DPD2 among the plurality of second driving pads DPD.

The first dam DAM1 and the second dam DAM2 may cross the fan-out line FL. The first dam DAM1 and the second dam DAM2 may be extended in the first direction (X-axis direction) in the non-display area NDA under the display panel 100. The second dam DAM2 may be located outside the first dam DAM1. The first dam DAM1 may be located closer to a display area DA2 than the second dam DAM2, and the second dam DAM2 may be located closer to the edge EG of the display panel 100 than the first dam DAM1.

Figure 8:
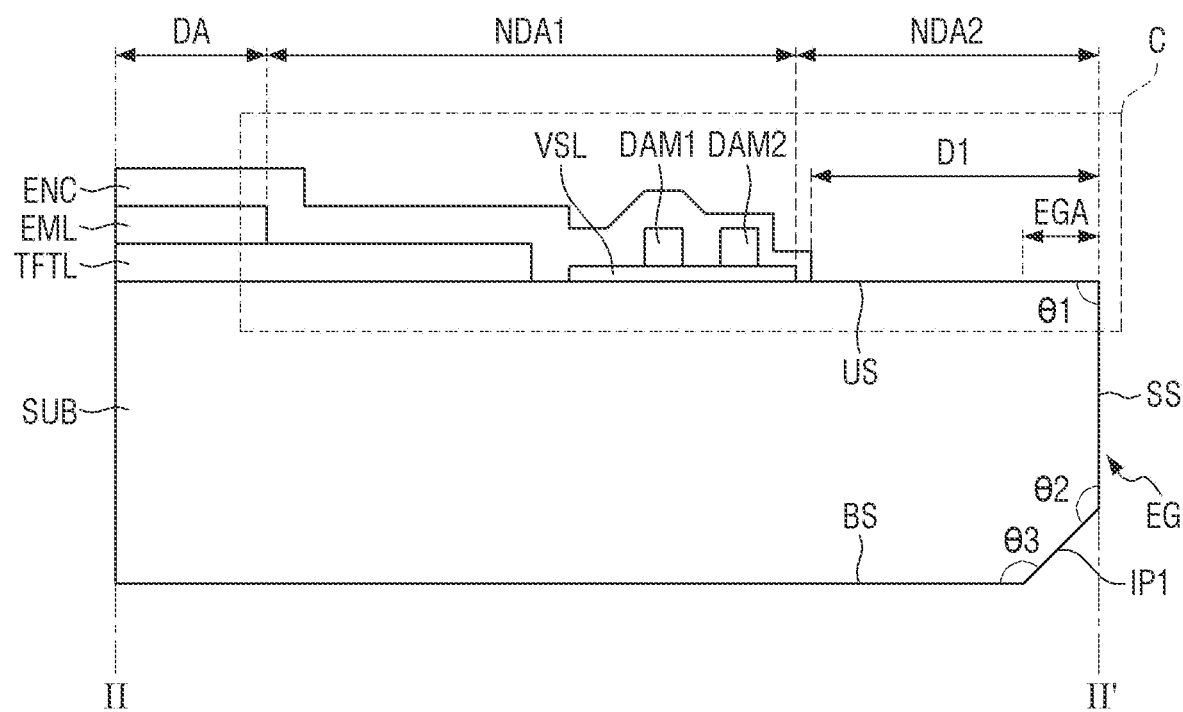
FIG. 8 is a cross-sectional view illustrating an example of a display panel taken along the line II-II' of FIG. 6 according to some embodiments.
Figure 9:
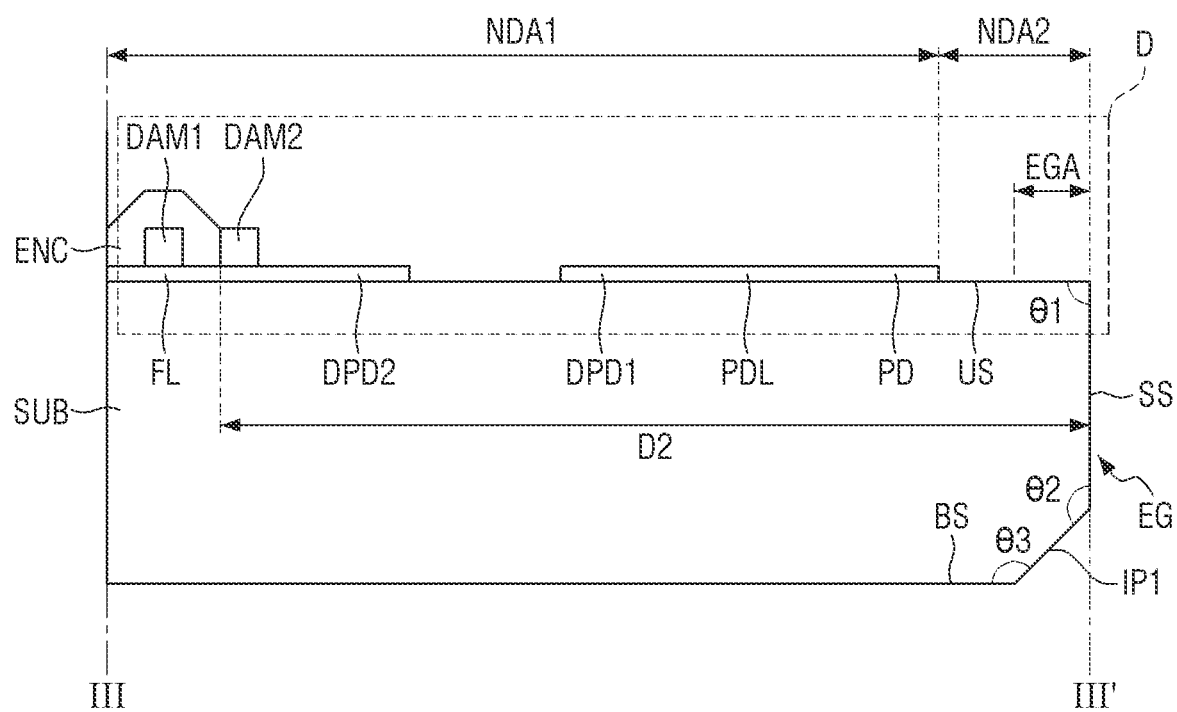
FIG. 9 is a cross-sectional view illustrating an example of a display panel taken along the line III-III' of FIG. 7 according to some embodiments.

FIG. 8 is a cross-sectional view illustrating an example of a display panel taken along the line II-II' of FIG. 6 according to some embodiments. FIG. 9 is a cross-sectional view illustrating an example of a display panel taken along the line III-III' of FIG. 7 according to some embodiments.

FIGS. 8 and 9 schematically show a cross-section of the display panel 100 when the substrate SUB of the display panel 100 is cut by irradiating a laser during the manufacturing process of the display panel 100 and then spraying an etchant.

Referring to FIGS. 8 and 9, the edge area EGA may be an area in which a processing mark is formed on the upper surface UP of the substrate SUB by irradiated laser when the edge area EGA is irradiated with a laser and then an etchant is sprayed to cut the substrate SUB by irradiated laser. According to some embodiments, the edge area EGA may be within about 50 μm. The edge area EGA left by laser processing by a width of about 50 μm or less along the edge EG may be formed in the display panel 100.

The substrate SUB of the display panel 100 may include the upper surface US on which the light emitting element layer EML is located, the other side of the upper surface US, the bottom surface BS, the side surface SS connected to the upper surface US but not parallel to the upper surface US, and the first inclined surface IP1 connected to the side surface SS and the bottom surface BS and not parallel to the side surface SS and the bottom surface BS.

The first inclined surface IP1 may be inclined rather than perpendicular to the third direction (Z-axis direction). The first inclined surface IP1 may be formed by irradiating a laser and then spraying an etchant. The first inclined surface IP1 is arranged to overlap the edge area EGA, and the processing mark formed on the upper surface UP of the substrate SUB may overlap the first inclined surface IP1 in the third direction (Z-axis direction).

An angle θ1 between the side surface SS and the upper surface UP of the substrate SUB of the display panel 100 may be about 90°. That is, the angle between the side surface SS and the upper surface UP of the substrate SUB may be substantially close to a vertical angle. An angle 82 formed between the side surface SS of the substrate SUB and the first inclined surface IP1 and an angle 82 formed between the first inclined surface IP1 and the bottom surface BS may be obtuse angles.

The first inclined surface IP1 is an inclined surface formed directly by the etchant whereas the processing mark is a trace formed by the penetration of the etchant penetrating between an acid-resistant film and the upper surface of the substrate SUB in the manufacturing process. Therefore, the width of the edge area EGA in which the processing marks are formed may be smaller than the width of the first inclined surface IP1. The width of the edge area EGA indicates a length of the edge area EGA in the first direction (X-axis direction) or in the second direction (Y-axis direction). The width of the first inclined surface IP1 indicates a length of the first inclined surface IP1 in the first direction (X-axis direction) or in the second direction (Y-axis direction).

According to some embodiments, a distance D1 from the edge EG of the display panel 100 to the encapsulating layer ENC may be at most about 300 μm or less. When the substrate SUB is cut by spraying the etchant after laser irradiation, the distance D1 from the edge EG of the display panel 100 to the encapsulating layer ENC may vary depending on the tolerance of one side of the laser. For example, when the laser unilateral tolerance is 50 μm, the distance D1 from the edge EG of the display panel 100 to the encapsulating layer ENC may be 200 μm or less. However, the present disclosure is not limited thereto. The distance D1 from the edge EG of the display panel 100 to the encapsulating layer ENC may be 0 μm. A description of the distance D1 from the edge EG of the display panel 100 to the encapsulating layer ENC due to the laser unilateral tolerance will be described later in conjunction with the manufacturing process of the display device 10.

The display pad PD may be the outermost structure located on the outermost side under the display panel 100. Even under the display panel 100, a distance D2 between the edge EG of the display panel 100 and the encapsulating layer ENC may be about 300 μm or less. However, because the display pads PD are located below the display panel 100, the distance D1 between the edge EG and the encapsulating layer ENC on the left and right sides and the upper side of the display panel 100 may be smaller than the distance D2 between the edge EG and the encapsulating layer ENC on the bottom side of the display panel 100. Also, according to some embodiments, the minimum distance between the display pad PD and the edge EG may be about 80 μm or less.

The minimum distance from the display pad PD to the edge EG of the substrate SUB may be the sum of the width of the edge area EGA and the minimum distance from the display pad PD to the edge area EGA. When the substrate SUB is cut by spraying the etchant after laser irradiation, the minimum distance from the display pad PD to the edge EG of the substrate SUB may vary depending on the tolerance of one side of the laser. For example, when the minimum distance between the display pad PD and the edge EG is designed to be approximately 80 μm, the minimum distance between the display pad PD and the edge EG may be 130 μm or less due to the unilateral tolerance of 50 μm of the laser.

The display panel 100 may cut the substrate SUB of the display panel 100 by irradiating the laser during the manufacturing process and then spraying the etchant, and the side surface SS and the first inclined surface IP1 of the display panel 100 may be etched by the etchant. The roughness of the side surface SS and the first inclined surface IP1 of the display panel 100 may be about 0.5 μm or less. When the substrate SUB of the display panel 100 is cut by spraying the etching solution after irradiating the laser, the roughness of the side surface SS and the first inclined surface IP1 of the display panel 100 may be relatively smaller than when the substrate SUB is cut with a cutting member and then a polishing process is performed.

In addition, because the side surface SS of the display panel 100 is formed by the laser and the etchant, while the first inclined surface IP1 is formed by the etchant. Accordingly, the roughness of the side surface SS of the display panel 100 may be different from the roughness of the first inclined surface IP1. For example, a difference between the roughness of the side surface SS of the display panel 100 and the roughness of the first inclined surface IP1 may be approximately 1% to 20%.

Figure 10:
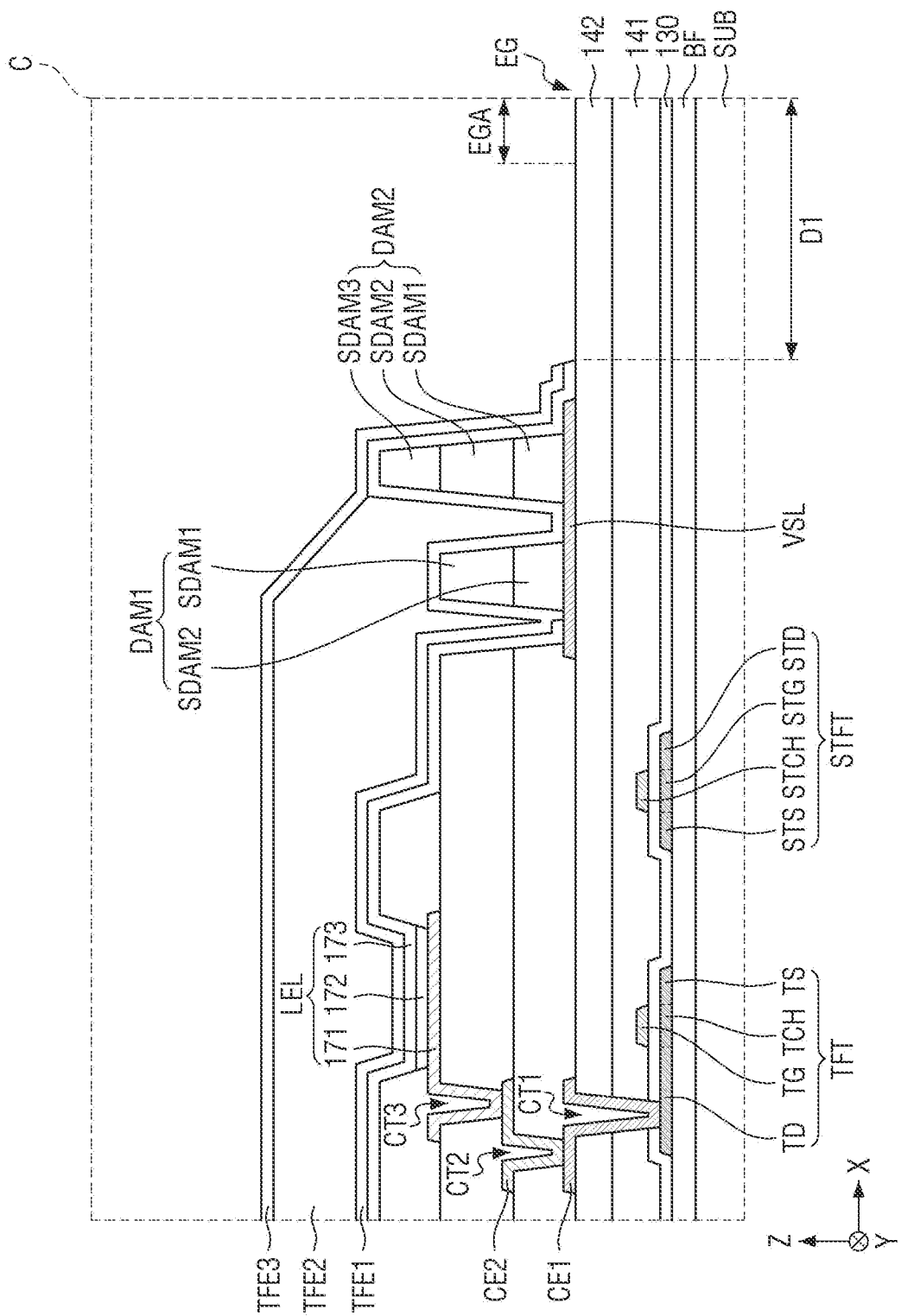
FIG. 10 is a cross-sectional view illustrating further details of the area C of FIG. 8 according to some embodiments.

FIG. 10 is a cross-sectional view illustrating area C of FIG. 8 in more detail. In FIG. 10, the stacked structure on the right side of the display panel 100 is illustrated in more detail.

Referring to FIG. 10, the first power supply line VSL may include the same material as the first data metal layer including the first connection electrode CE1 and the data lines and may be located on the same layer. The first power supply line VSL may be located on the second interlayer insulating layer 142. The first power supply line VSL may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

The first dam DAM and the second dam DAM2 may be located on the first power supply line VSL. The first dam DAM1 may include a first sub-dam SDAM1 and a second sub-dam SDAM2, and the second dam DAM2 may include the first sub-dam SDAM1, the second sub-dam SDAM2, and a third sub-dam SDAM3. The first sub-dam SDAM1 may include the same material as the first organic layer 160 and may be located on the same layer. The second sub-dam SDAM2 may include the same material as the second organic layer 180 and may be located on the same layer. The third sub-dam SDAM3 may include the same material as the bank 190 and may be located on the same layer.

The height of the first dam DAM1 may be bottom than the height of the second dam DAM2, but the embodiments of the present specification are not limited thereto. The height of the first dam DAM1 may be substantially the same as the height of the second dam DAM2 or may be higher than the height of the second dam DAM2.

The common electrode 173 may be connected to the first organic layer 160, the second organic layer 180, and the first power supply line VSL that is not covered by the first dam DAM1 and is exposed. Accordingly, the common electrode 173 may receive the first power supply voltage of the first power supply line VSL.

The first encapsulating inorganic layer TFE1 may cover the first dam DAM1 and the second dam DAM2 in the non-display area NDA on the left side of the display panel 100. The first encapsulating inorganic layer TFE1 may be extended from the non-display area NDA on the left side of the display panel 100 to cover the first power supply line VSL.

The encapsulating organic layer TFE2 may be arranged to cover the upper surface of the first dam DAM1 and not to cover the upper surface of the second dam DAM2. However, the embodiments of the present specification are not limited thereto. The encapsulating organic layer TFE2 may not cover both the upper surface of the first dam DAM1 and the upper surface of the second dam DAM2. The encapsulating organic layer TFE2 may not overflow to the edge EG of the display panel 100 due to the first dam DAM1 and the second dam DAM2.

The second encapsulating inorganic layer TFE3 may cover the first dam DAM1, the second dam DAM2, and a crack dam CRD in the non-display area NDA on the left side of the display panel 100. The second encapsulating inorganic layer TFE3 may be extended from the non-display area NDA on the left side of the display panel 100 to the edge EG of the display panel 100.

An inorganic encapsulating area in which the first encapsulating inorganic layer TFE1 and the second encapsulating inorganic layer TFE3 contact each other may be formed from the second dam DAM2 to the edge EG of the display panel 100. The inorganic encapsulating area may be arranged to surround the second dam DAM2.

In addition, a scan thin film transistor STFT of the scan driving circuit unit SDC is illustrated in FIG. 10. Because the scan thin film transistor STFT is substantially the same as the thin film transistor TFT described with reference to FIG. 6, a description of the scan thin film transistor STFT will be omitted.

It is illustrated in FIG. 10 that the first encapsulating inorganic layer TFE1 and the second encapsulating inorganic layer TFE3 of the encapsulation layer ENC are located only to a position closer to the second dam DAM2 than to the edge EG of the display panel 100. Accordingly, according to some embodiments, the edge area EGA where the laser-irradiated trace remains may not overlap the first encapsulating inorganic layer TFE1 and the second encapsulating inorganic layer TFE3 of the encapsulating layer ENC. However, the present disclosure is not limited thereto. In some embodiments, the first encapsulating inorganic layer TFE1 and the second encapsulating inorganic layer TFE3 of the encapsulation layer ENC may be extended to the edge EG of the display panel 100 in the display panel 100 of the display device and the edge area EGA may overlap the encapsulating layer ENC.

Figure 11:
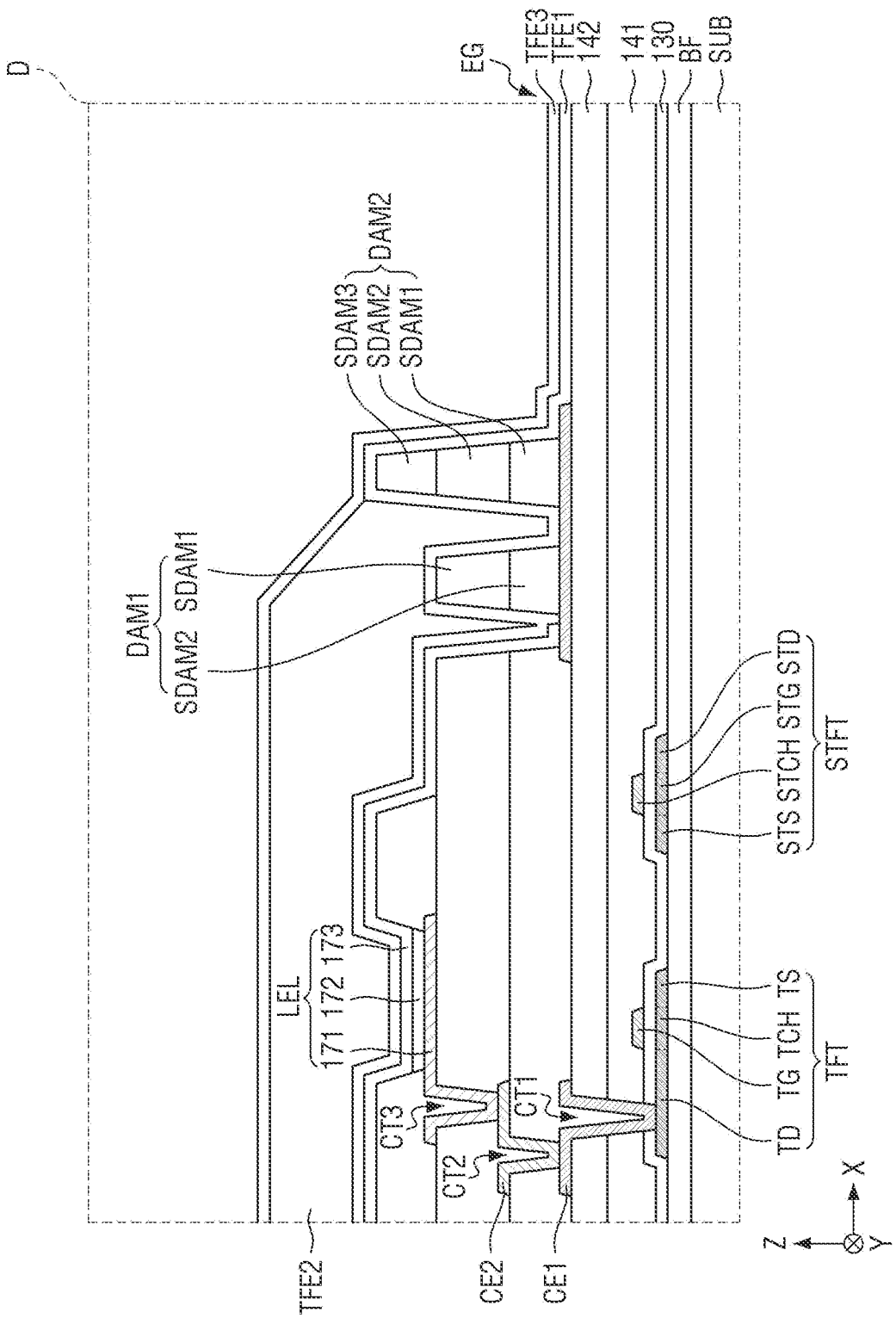
FIG. 11 is a cross-sectional view illustrating further details of the area C of FIG. 8 according to some embodiments.

FIG. 11 is a cross-sectional view illustrating another example of area C of FIG. 8 in more detail.

Referring to FIG. 11, the first encapsulating inorganic layer TFE1 and the second encapsulating inorganic layer TFE3 cover the first dam DAM1 and the second dam DAM2 in the non-display area NDA on the left side of the display panel 100 and may be extended to the edge EG of the display panel 100. An inorganic encapsulating area in which the first encapsulating inorganic layer TFE1 and the second encapsulating inorganic layer TFE3 contact each other may be formed from the second dam DAM2 to the edge EG of the display panel 100. The inorganic encapsulating area may surround the second dam DAM2 and may be extended to the edge EG of the display panel 100 to cover the second interlayer insulating layer 142.

Figure 12:
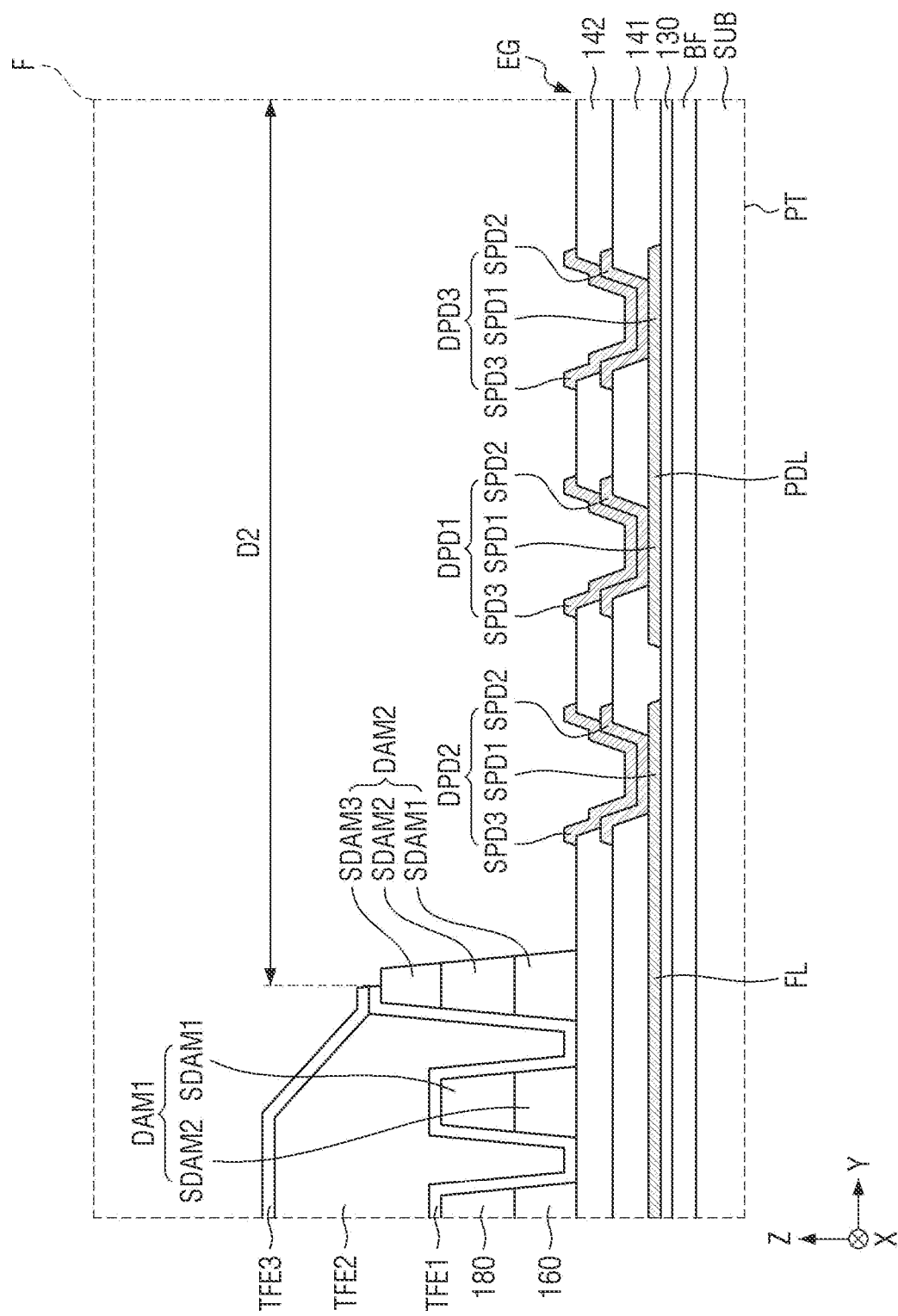
FIG. 12 is a cross-sectional view illustrating further details of the area D of FIG. 9 according to some embodiments.

FIG. 12 is a cross-sectional view illustrating an area D of FIG. 9 in more detail. FIG. 12 illustrates in more detail a stacked structure on the bottom side of the display panel 100.

Referring to FIG. 12, each of the display pad PD, the first driving pad DPD1, and the second driving pad DPD2 may include a first sub pad SPD1, a second sub pad SPD2, and a third sub pad SPD3.

The first sub pad SPD1 includes the same material as the first gate metal layer including the gate electrode TG, the first capacitor electrode CAE1 of the capacitor Cst, and the scan lines, and may be located on the same layer. The first sub pad SPD1 may be located on the gate insulating layer 130. The first sub pad SPD1 may be formed of a single layer or a multilayer formed of any one of molybdenum (Mo), aluminum (Al), chromium (Cr), gold (Au), titanium (Ti), nickel (Ni), neodymium (Nd), and copper (Cu) or an alloy thereof.

The second sub pad SPD2 may include the same material as the second gate metal layer including the second capacitor electrode CAE2 and may be located on the same layer. The second sub pad SPD2 may be located on the first interlayer insulating layer 141. The second sub pad SPD2 may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

The third sub pad SPD3 may include the same material as the first data metal layer including the first connection electrode CE1 and the data lines and may be located on the same layer. The third sub pad SPD3 may be located on the second interlayer insulating layer 142. The third sub pad SPD3 may be formed of a single layer or multiple layers made of any one of molybdenum (Mo), aluminum (Al), chromium (Cr), gold (Au), titanium (Ti), nickel (Ni), neodymium (Nd), and copper (Cu), or an alloy thereof.

The third sub pad SPD3 of the display pad PD may be electrically connected to the circuit board 300 through the conductive adhesive member such as the anisotropic conductive film or the anisotropic conductive adhesive. The third sub pad SPD3 of the first driving pad DPD1 may be electrically connected to an input bump of the driving IC 200 through the conductive adhesive member such as the anisotropic conductive film or the anisotropic conductive adhesive. The third sub pad SPD3 of the second driving pad DPD2 may be electrically connected to an output bump of the driving IC 200 through the conductive adhesive member such as the anisotropic conductive film or the anisotropic conductive adhesive. For convenience of description, the driving IC 200 and the circuit board 300 are omitted in FIG. 12.

The first encapsulating inorganic layer TFE1 and the second encapsulating inorganic layer TFE3 may be arranged to cover the first dam DAM1 and a part of the second dam DAM2 under the display panel 100. For example, the first encapsulating inorganic layer TFE1 and the second encapsulating inorganic layer TFE3 may be arranged not to cover a part of the upper surface of the second dam DAM2. Alternatively, the first encapsulating inorganic layer TFE1 and the second encapsulating inorganic layer TFE3 may be covered, but in this case, the third sub pad SPD3 of the second driving pad DPD2 may not be covered. That is, the first encapsulating inorganic layer TFE1 and the second encapsulating inorganic layer TFE3 may not be extended to the display pad PD, the first driving pad DPD1, and the second driving pad DPD2 adjacent the edge EG of the display panel 100 in the bottom side of the display panel 100.

The display device 10 according to some embodiments may be formed by the process of cutting the substrate SUB of the display panel 100 through a process of irradiating a laser and then spraying the etchant. Because the substrate SUB is cut by a process using a laser, the distances D1 and D2 from the encapsulating layer ENC to the edge EG of the display panel 100 in the display panel 100 may be smaller than a case in which the polishing process is performed after the substrate SUB is cut using a cutting member. Accordingly, the display device 10 may greatly reduce the width of the non-display area of the display panel 100, in particular, the second non-display area NDA2, and minimize or reduce an area that unnecessarily occupies space in the display panel 100.

Hereinafter, a manufacturing process of the display device 10 according to some embodiments will be described with reference to other drawings.

Figure 13:
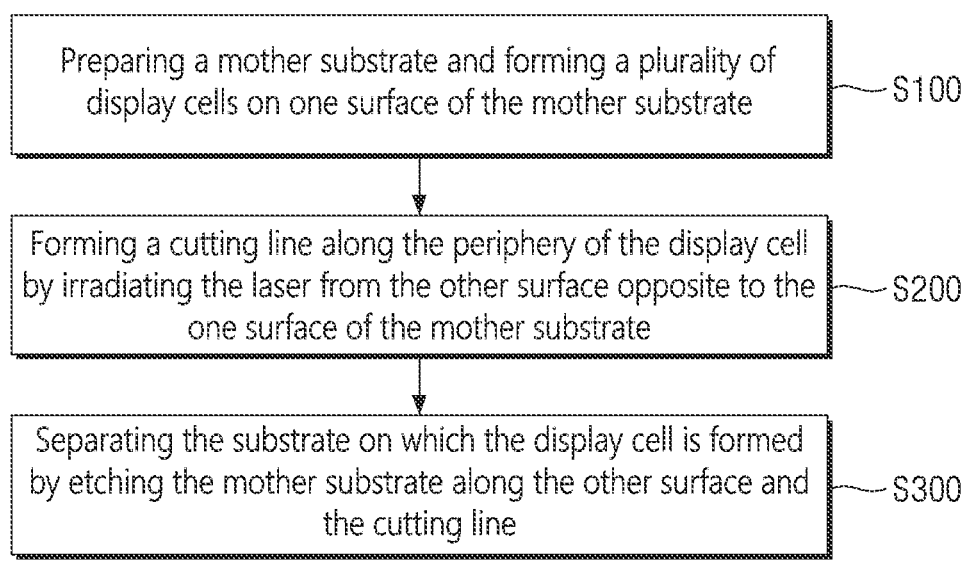
FIG. 13 is a flowchart illustrating a manufacturing process of a display device according to some embodiments.

FIG. 13 is a flowchart illustrating a manufacturing process of a display device according to some embodiments.

Referring to FIG. 13, the method of manufacturing the display device 10 according to some embodiments may include preparing the mother substrate ('MSUB' in FIG. 14) and forming the plurality of display cells ('DPC' in FIG. 14) on one surface of the mother substrate (MSUB) (S100), forming a cutting line ('LS' in FIG. 15) along the periphery of the display cell (DPC) by irradiating the laser from the other surface opposite to the one surface of the mother substrate (MSUB) (S200), separating the substrate SUB on which the display cell DPC is formed by etching the mother substrate MSUB along the other surface and a cutting line LS (S300).

The display device 10 may be formed through the process of separating a plurality of substrates SUB on which one display cell DPC is formed from the mother substrate MSUB on which the plurality of display cells DPC are formed. The process of separating the plurality of substrates SUB from the mother substrate MSUB may include the process of irradiating the laser and the process of separating the substrates SUB by etching the mother substrate MSUB. The display device 10 may be manufactured by performing the laser process, and the substrate SUB may minimize or reduce the area of the outer part where the display cells DPC are not located.

Hereinafter, the manufacturing process of the display device 10 will be described in more detail with reference to other drawings.

FIGS. 14 to 18 are perspective views sequentially illustrating a part of a manufacturing process of a display device according to some embodiments. FIGS. 19 to 22 are cross-sectional views sequentially illustrating a part of a manufacturing process of a display device according to some embodiments.

FIGS. 14 to 18 are perspective views of the mother substrate MSUB and the plurality of display cells DPC located on the mother substrate MSUB. FIGS. 19 to 23 show cross-sections of the mother substrate MSUB and the plurality of display cells DPC cut along the line VIII-VIII' in FIGS. 14 to 18.

Figure 14:
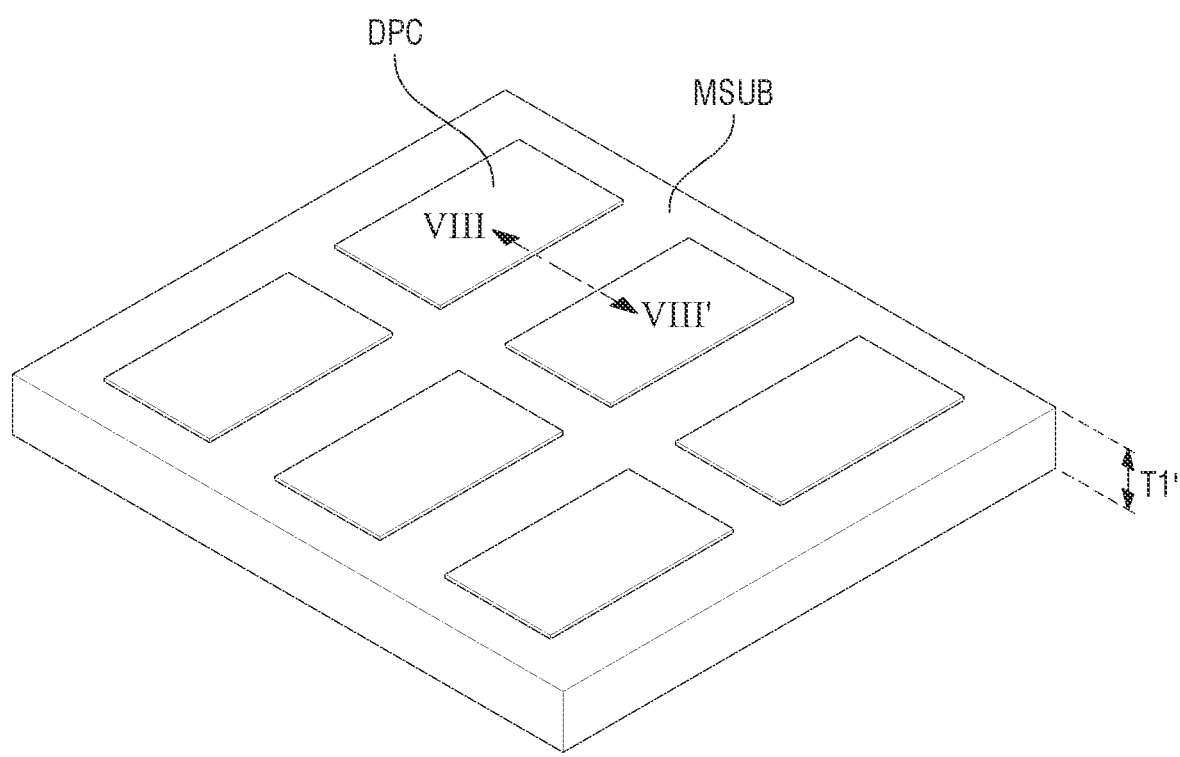
FIGS. 14 to 18 are perspective views sequentially illustrating a manufacturing process of a display device according to some embodiments.
Figure 19:
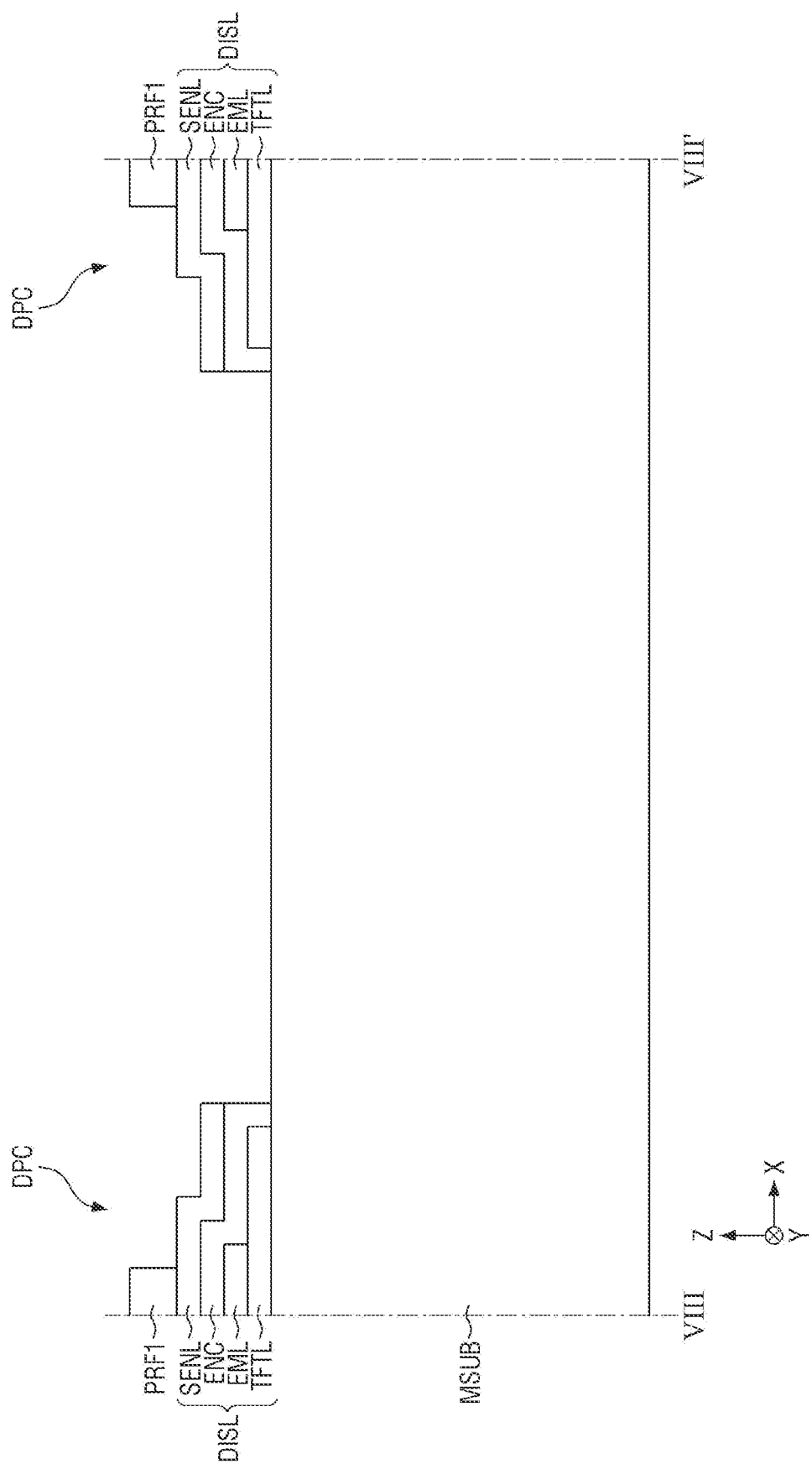
FIGS. 19 to 23 are cross-sectional views sequentially illustrating a manufacturing process of a display device according to some embodiments.

Referring to FIGS. 14 and 19, first, the plurality of display cells DPC are formed on the first surface of the mother substrate MSUB, then, the plurality of first protective films PRF1 are attached on the plurality of display cells DPC, finally, the plurality of display cells DPC are inspected.

The display layer DISL of each of the plurality of display cells DPC is formed on the first surface of the mother substrate MSUB. The display layer DISL includes the thin film transistor layer TFTL, the light emitting element layer EML, the encapsulating layer ENC, and the sensor electrode layer SENL. The description of the structure of the display layer DISL is the same as described above.

Next, the first protective film layer is attached to cover the plurality of display cells DPC and the mother substrate MSUB located between the plurality of display cells DPC. Then, the plurality of first protective films PRF1 may be respectively located on the plurality of display cells DPC by removing a portion of the first protective film layer located on the mother substrate MSUB. A portion of the first protective film layer may be removed, and the remaining portions may be the plurality of first protective films PRF1. The plurality of first protective films PRF1 may be respectively located on the plurality of display cells DPC. The plurality of first protective films PRF1 may be arranged to correspond to the plurality of display cells DPC on a one-to-one basis.

Each of the plurality of first protective films PRF1 may be a buffer film for protecting the plurality of display cells DPC from external impact. The plurality of first protective films PRF1 may be made of a transparent material.

Next, the plurality of display cells DPC are inspected using the inspection apparatus. After a probe is connected to a plurality of test pads provided in each of the plurality of display cells DPC, a lighting test of each of the plurality of display cells DPC may be performed.

When the lighting test is performed after the plurality of display cells DPC are separated from the mother substrate MSUB by the cutting process, an additional process for removing the plurality of test pads is required after the lighting test is completed. On the other hand, when the lighting test is performed on the mother substrate MSUB, the plurality of test pads are removed later when the plurality of display cells DPC are separated from the mother substrate MSUB by laser irradiation and etching. Therefore, when the lighting test is performed on the mother substrate MSUB, there may be an advantage that the separate additional process for removing the plurality of test pads is not required.

Figure 15:
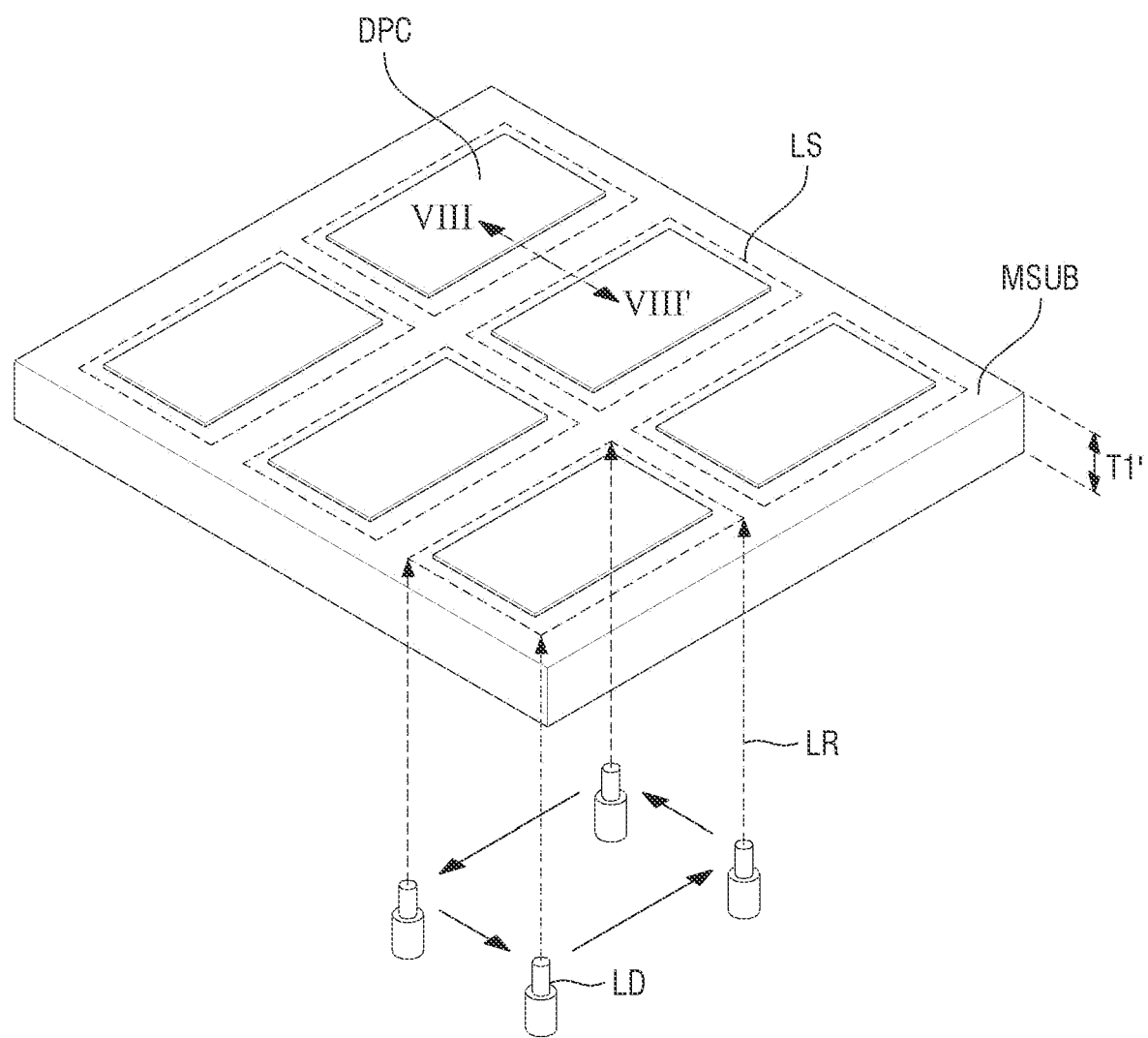
Figure 20:
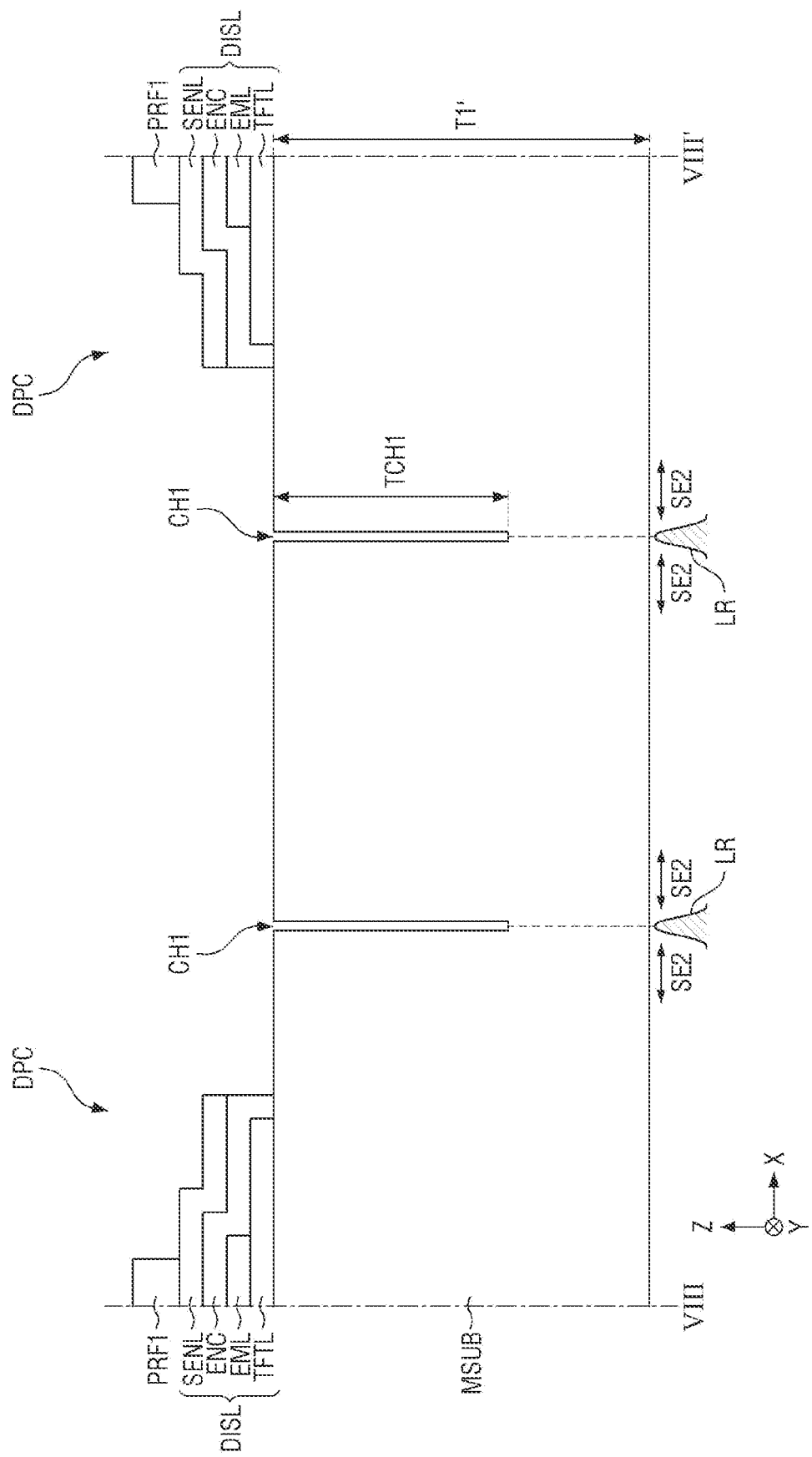

Next, as shown in FIGS. 15 and 20, the plurality of first cutting holes CH1 are formed along edges of the plurality of display cells DPC by the laser LR is irradiated on the second surface opposite to the first surface of the mother substrate MSUB.

The cutting line LS may be sketched by irradiating the laser LR to form the plurality of first cutting holes CH1 along edges of the plurality of display cells DPC. The cutting line LS may be formed along edges of the plurality of display cells DPC.

Various lasers may be used as the laser LR for sketching the cutting line LS. According to some embodiments, the laser LR may be an infrared-based Bessel beam having a wavelength of approximately 1030 nm.

The laser LR may be irradiated on the second surface of the mother substrate MSUB. However, the embodiments of the present specification are not limited thereto. The laser LR may be irradiated on the first surface of the mother substrate MSUB.

The tolerance on one side of the laser LR may be within about 50 μm, and the tolerance on both sides of the laser may be within about 100 μm. The unilateral tolerance of the laser LR may be a cutting error in one direction (e.g., the X-axis direction) when the first cutting holes CH1 are formed with the laser LR to sketch the cutting line LS.

The distance from the encapsulating layer ENC to the edge EG of the display panel 100 may be affected by the unilateral tolerance SE2 of the laser LR. When the laser LR is correctly irradiated to a position to be irradiated, the distance from the encapsulating layer ENC to the first cutting hole CH1 is defined as "DCH".

When the laser LR is irradiated to the left by the maximum value of the unilateral tolerance of the laser LR, the distance from the encapsulating layer ENC to the first cutting hole CH1 may be "DCH−SE2". In contrast, when the laser LR is irradiated to the right by the maximum value of the unilateral tolerance of the laser LR, the distance from the encapsulating layer ENC to the first cutting hole CH1 may be "DCH+SE2".

Because the substrate SUB of the display cell DPC is separated from the mother substrate MSUB in the next step, the etching process, based on the first cutting hole CH1, the distance from the encapsulating layer ENC to the first cutting hole CH1 may be substantially the same as the minimum distance from the encapsulation layer ENC to the edge EG of the display panel 100 in the display panel 100 illustrated in FIG. 8. Therefore, the minimum distance from the encapsulating layer ENC to the edge EG of the display panel 100 in the display panel 100, in some cases, may be a difference of 100 μm, which is a distance corresponding to "unilateral tolerance×2" (or "double-sided tolerance") of the laser (LR).

The distance D1 from the encapsulating layer ENC to the edge EG of the display panel 100 may be "DCH−SE2" to "DCH+SE2" in the display panel 100 illustrated in FIG. 8. For example, when the distance DCH from the encapsulating layer ENC to the first cutting hole CH1 is 50 μm and the unilateral tolerance of the laser LR is 50 μm, the distance D1 from the encapsulating layer ENC to the edge EG of the display panel 100 may have a deviation of about 100 μm in the display panel 100 illustrated in FIG. 8 according to the unilateral tolerance of the laser LR in the range of 300 μm or less. The distance D1 to the edge EG of the display panel 100 may be a minimum of 0 μm or a maximum of 300 μm or less.

The one-side tolerance of the laser LR is 50 μm, which may be smaller than the one-sided tolerance when the substrate SUB is cut using the cutting member. That is, because the tolerance on one side of the laser LR is smaller than the tolerance on one side of the cutting member, the distance from the encapsulating layer ENC to the edge EG of the display panel 100 may be reduced when cutting using the laser LR.

When the laser LR is irradiated on the second surface of the mother substrate MSUB, a depth (or sketch length) TCH1 of each of the plurality of first cutting holes CH1 formed by the laser LR may be adjusted by adjusting a repetition rate, a machining rate, and a pulse energy. For example, the depth TCH1 of each of the plurality of first cutting holes CH1 may be at least 50 μm from the first surface of the mother substrate MSUB. Also, the mother substrate MSUB may have a thickness in a range of 400 μm to 600 μm. When the thickness of the mother substrate MSUB is approximately 500 μm, the depth TCH1 of each of the plurality of first cutting holes CH1 may be up to 500 μm. That is, the depth TCH1 of each of the plurality of first cutting holes CH1 may be approximately 50 μm to 500 μm from the first surface of the mother substrate MSUB.

The laser LR to form the first cutting holes CH1 may be irradiated with the repetition rate of 10 kHz to 250 kHz, the processing speed of 10 mm/s to 250 mm/s, and the pulse energy of 10 uJ to 300 uJ. However, some embodiments may irradiate with the repetition rate of approximately 17.5 kHz to 125 kHz, the processing speed of 17.5 mm/s to 125 mm/s, and the pulse energy of 25 uJ to 178 uJ in order for the laser LR1 to have the depth of about 225 μm from the first surface of the mother substrate MSUB.

Meanwhile, the drawing illustrates a case in which the first cutting hole CH1 is formed in the mother substrate MSUB by irradiation of the laser LR. However, the present disclosure is not limited thereto. The first cutting hole CH1 is not formed even when the laser LR is irradiated according to the intensity of the laser LR and the material of the mother substrate MSUB. Also, a laser irradiation area in which physical properties are changed may be formed in the area irradiated with the laser. As will be described later, the laser irradiation area may have a different etching rate than other portions in the etching process of the mother substrate MSUB and the same effect may be obtained when the first cutting hole CH1 is formed.

Figure 16:
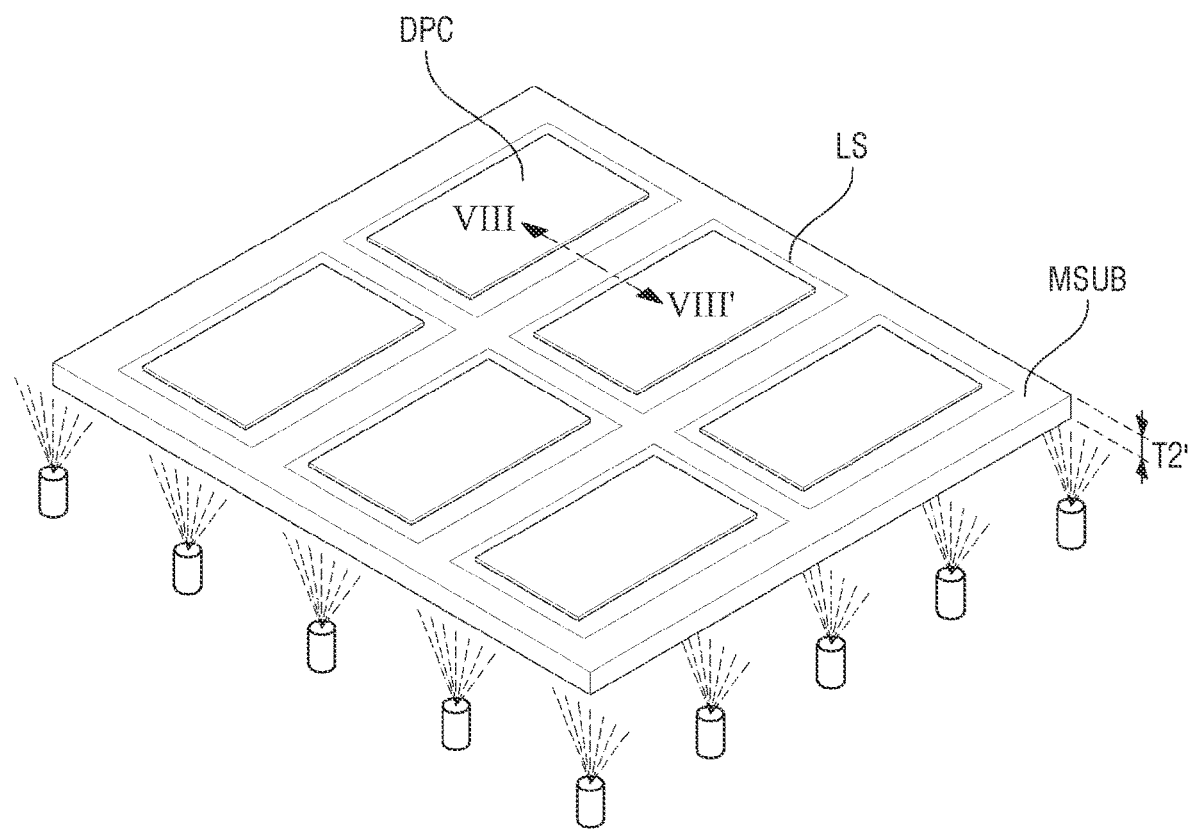
Figure 17:
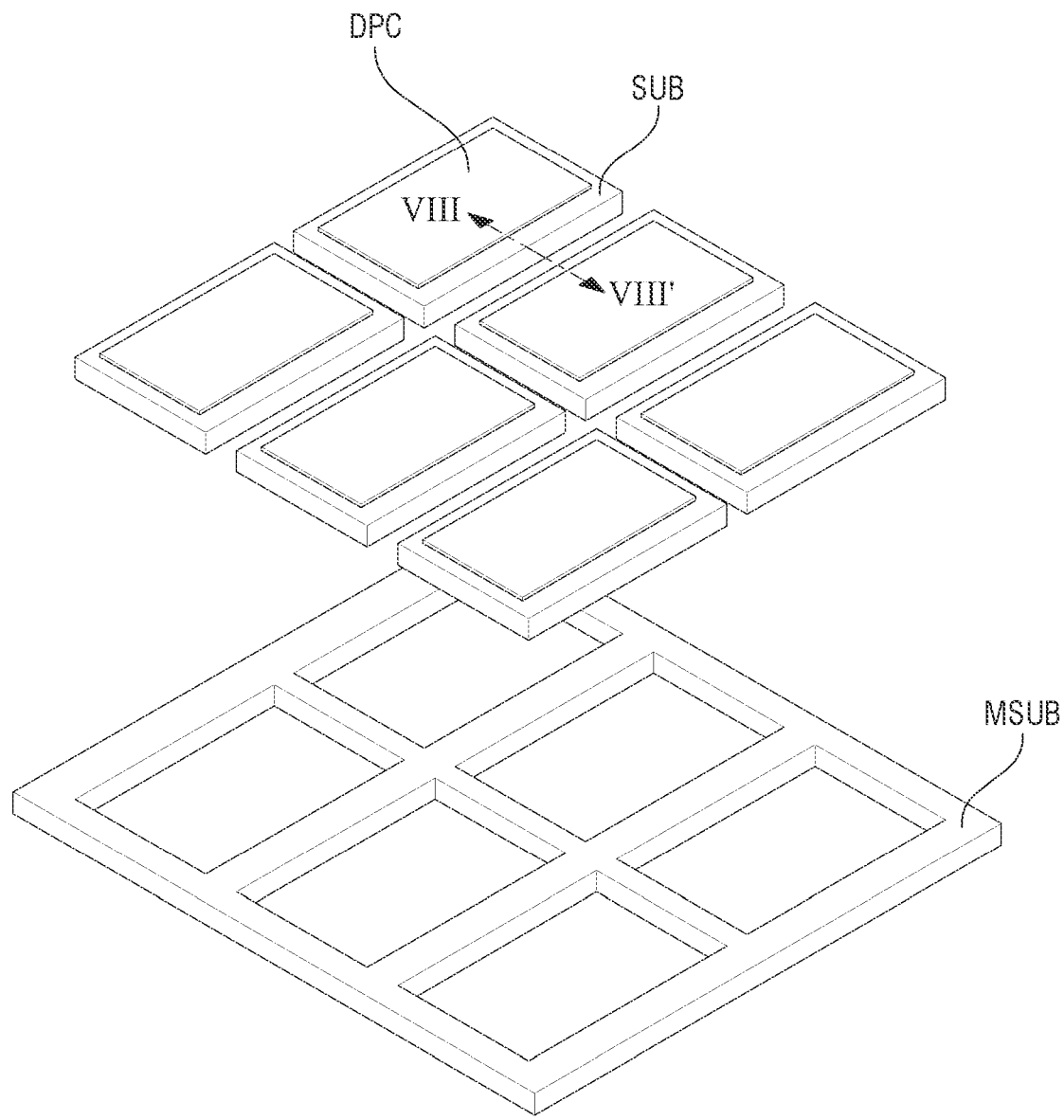
Figure 21:
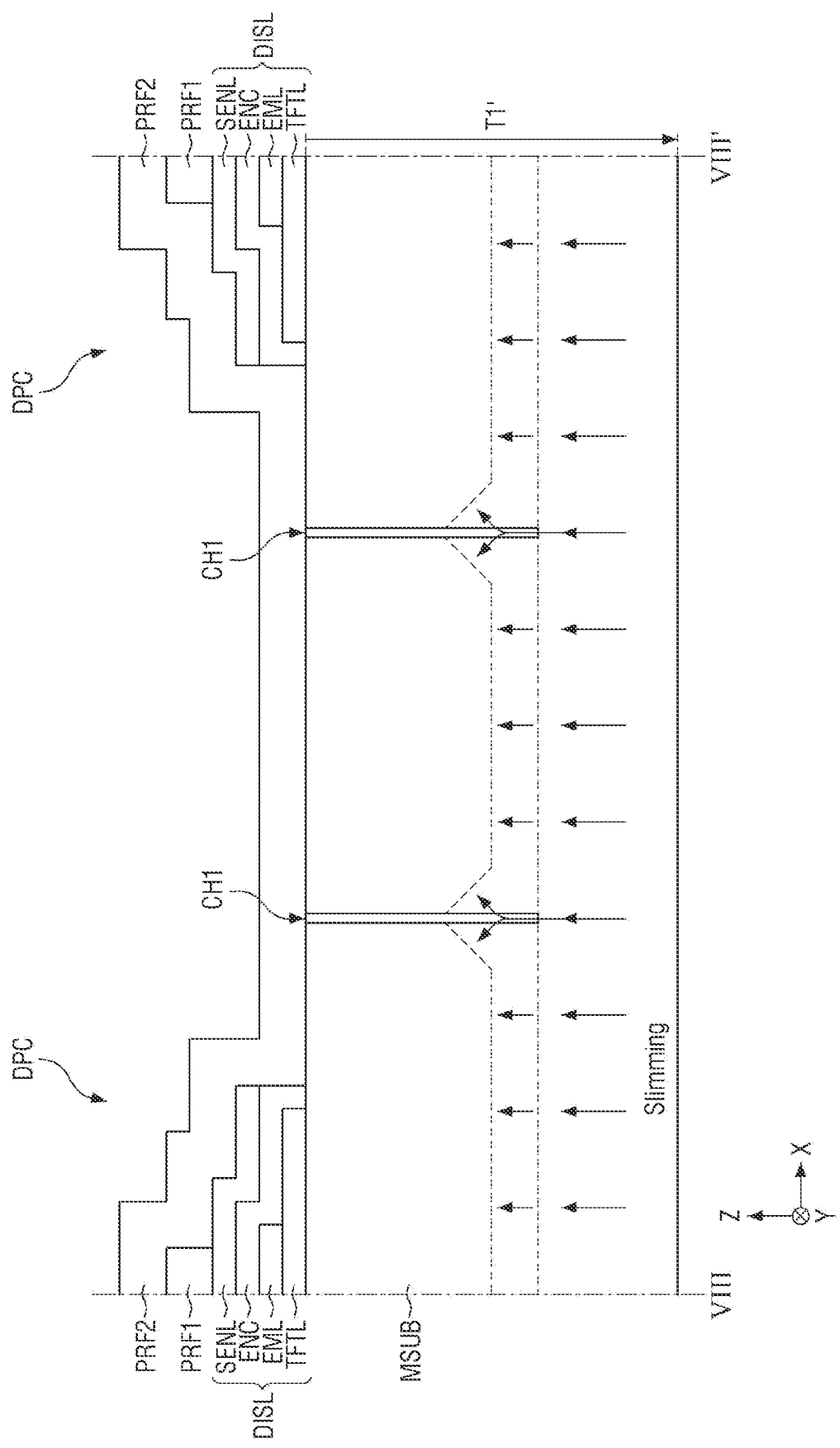
Figure 22:
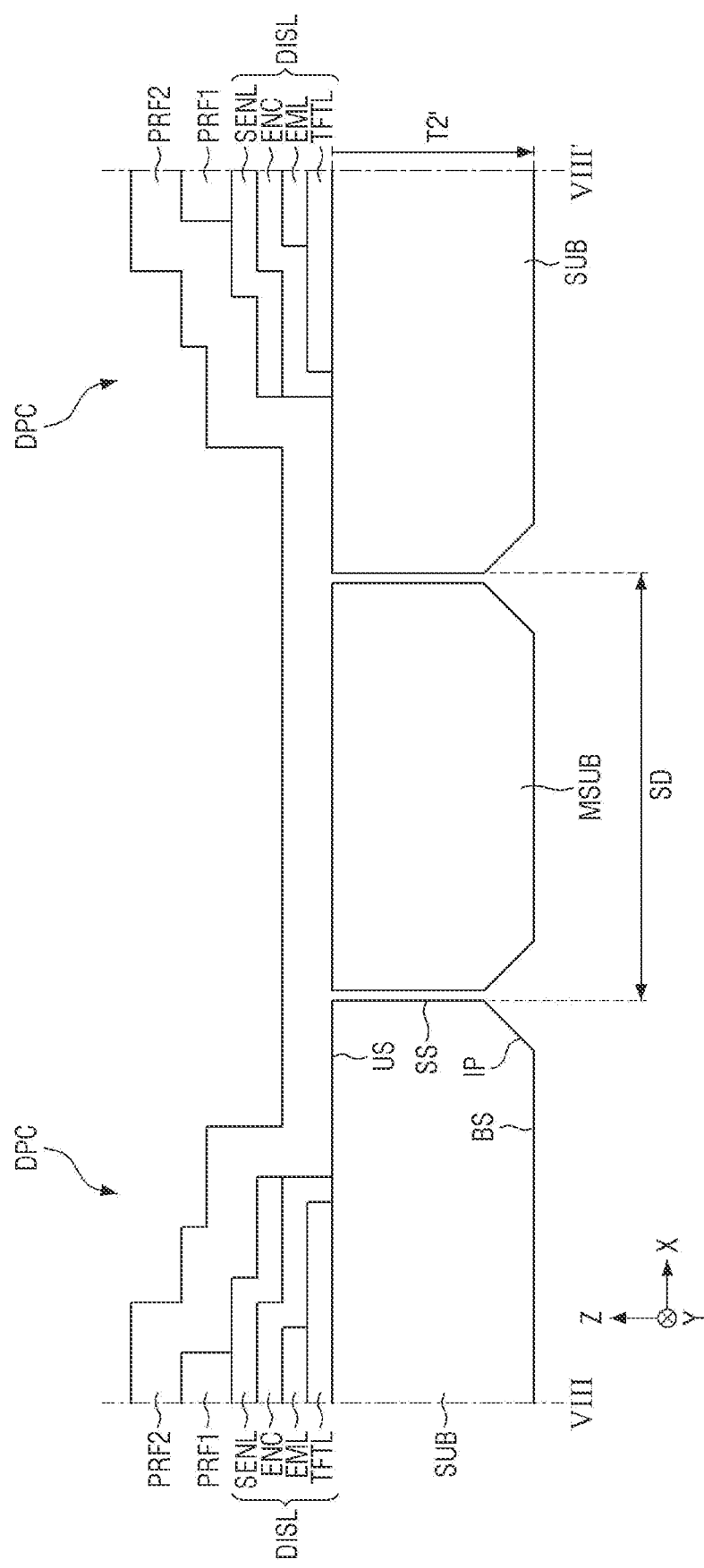
Figure 23:
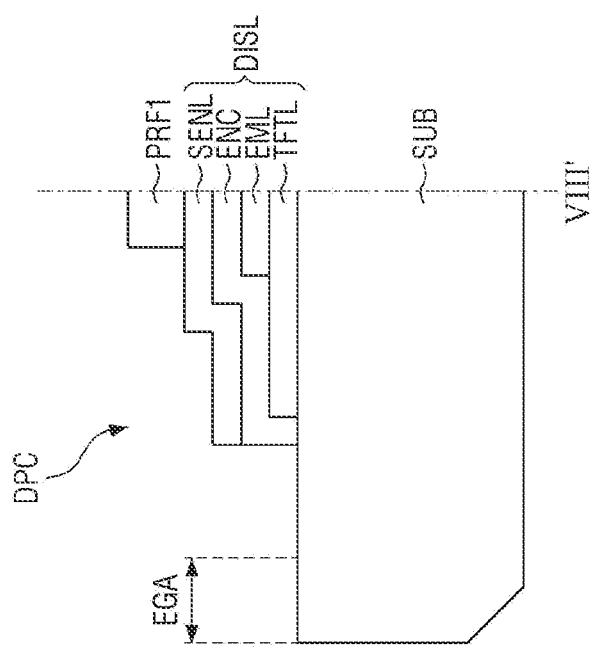
Figure 23:
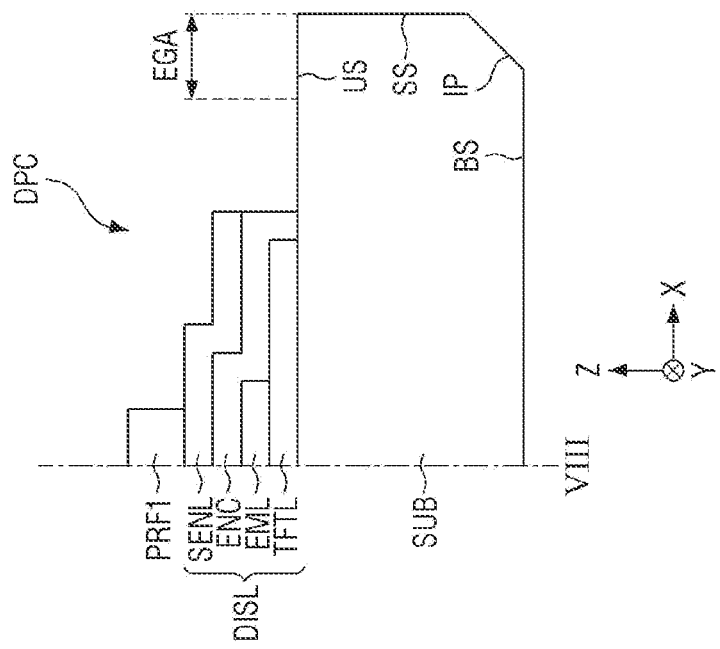

Next, as shown in FIGS. 16, 21 and 23, the second protective film PRF2 is attached on the plurality of first protective films PRF1 and the mother substrate MSUB is etched by spraying an etchant on the second surface of the mother substrate MSUB without a separate mask.

The second protective film PRF2 may be attached on the exposed mother substrate MSUB without being covered by the plurality of first protective films PRF1 and the plurality of first protective films PRF1. The second protective film PRF2 may cover the first cutting holes CH1. The second protective film PRF2 may be the acid-resistant film for protecting the plurality of display cells DPC from the etchant in the etching process of the mother substrate MSUB to be performed in the next step.

The mother substrate MSUB may be etched by spraying the etchant on the second surface without the separate mask. In the etching process using the etchant, the mother substrate MSUB may be cut along the plurality of first cutting holes CH1 while the thickness of the mother substrate MSUB is reduced.

When the etchant is sprayed on the second surface of the mother substrate MSUB, the mother substrate MSUB may be reduced from a first thickness T1' to a second thickness T2'. Because the mother substrate MSUB is etched without the separate mask, isotropic etching may be performed in which all areas of the second surface of the mother substrate MSUB are uniformly etched up to the area in which the first cutting holes CH1 are formed.

At this time, when the thickness of the mother substrate MSUB is decreased by the etchant and the etchant penetrates into the plurality of first cutting holes CH1 formed by the laser LR, a difference in etch rate may occur in an area in which the first cutting holes CH1 are formed and in an area in which the first cutting holes CH1 are not formed due to the plurality of first cutting holes CH1.

The mother substrate MSUB may have an increased surface area compared to an area not irradiated with the laser LR while the first cutting hole CH1 is formed in the area irradiated with the laser LR. As the area irradiated with the laser LR has a larger surface area than other areas, the etch rate may be faster by increasing the area in contact with the etchant. Also, in the area irradiated with the laser LR, the physical properties of the material of the mother substrate MSUB may change. A portion of the mother substrate MSUB irradiated with the laser LR may have a higher reactivity by the etchant than other portions and may have a faster etching rate.

Accordingly, the mother substrate MSUB may be anisotropically etched in which the etching rate in the area in which the first cutting holes CH1 is formed is faster than the etching rate in the area in which the first cutting holes CH1 are not formed. Accordingly, the substrate SUB separated from the mother substrate MSUB may include the inclined surface IP located between the side surface SS and the bottom surface BS.

In addition, as the etchant penetrates the plurality of first cutting holes CH1 formed by the laser LR, the mother substrate MUSB may be separated along the cutting line SL. That is, each of the plurality of display cells DPC may be separated from the mother substrate MSUB.

The first surface of the mother substrate MSUB is not penetrated by the etchant by the second protective film, whereas the second surface of the mother substrate MSUB is etched by the etching liquid. Accordingly, differences may occur between the first surface and the second surface of the mother substrate MSUB in roughness, hardness, light transmittance, light reflectance, local density, surface chemical structure, and the like. For example, dimples may occur due to the second etchant of the mother substrate MSUB.

On the other hand, the one-sided tolerance of the laser is about 50 μm, and the width of the first cutting hole CH1 formed by the laser LR may be expanded by about 40 μm by the etchant. Therefore, in consideration of the laser tolerance of each of the display cells DPC and the width of the first cutting hole CH1 extended by the etchant, a separation distance SD between the display cells DPC adjacent to each other is approximately 280 μm.

After the etching process is completed, the second protective film PRF2 may be detached.

Figure 18:
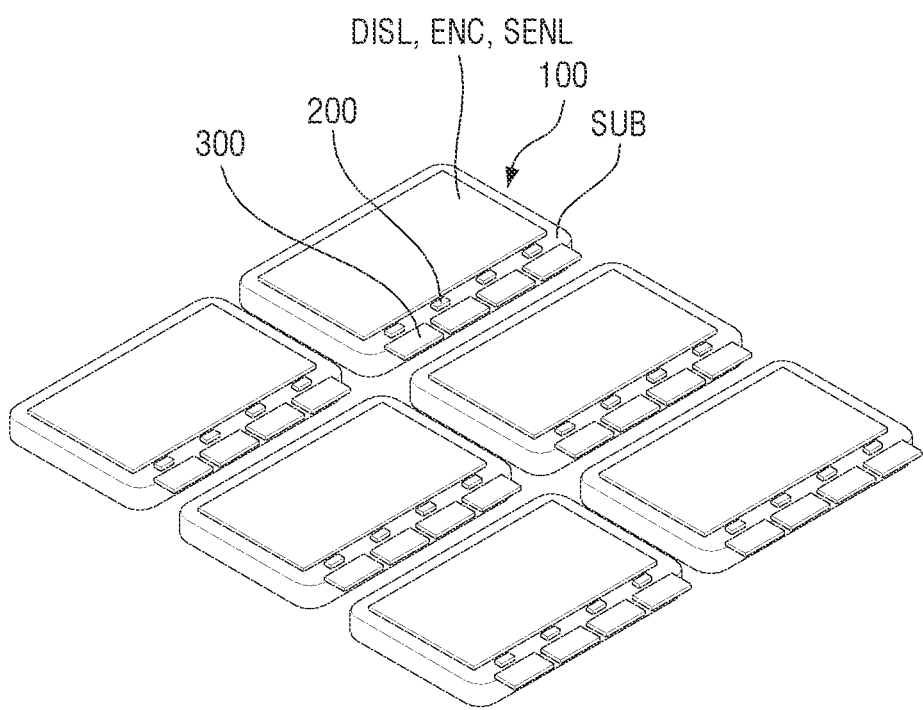

Next, as shown in FIG. 18, the display device 10 may be manufactured by attaching the driving IC 200 and the circuit board 300 to each of the plurality of display cells DPC and attaching the polarizing film PF and the cover window CW after detaching the first protective film PRF1 from each of the plurality of display cells DPC.

Because the method of manufacturing the display device 10 according to some embodiments performs the separation process of the mother substrate MSUB, the width between the display cells DPC of the display panel 100 and the edge of the display panel 100 may be minimized or reduced compared to the manufacturing method using the cutting member. That is, the display device 10 may minimize or reduce unnecessary space remaining in the outermost portion of the display panel 100. In addition, the method of manufacturing the display device 10 may increase the efficiency of the manufacturing process because the thickness of the mother substrate MSUB may be reduced by using the etching process and the substrate SUB of each of the plurality of display cells DPC may be separated from the mother substrate MSUB.

Meanwhile, the laser LR may be formed such that the plurality of first cutting holes CH1 are arranged along a curve when viewed from a plane by adjusting repetition rate, machining rate, and pulse energy. For example, corners of each of the plurality of display cells DPC may be formed in a round shape having a curvature by forming the plurality of first cutting holes CH1 in a curved shape, and then etching by spraying the etchant along the plurality of first cutting holes CH1. Because corners of each of the plurality of display cells DPC may be formed in the round shape without a separate polishing process in the method of manufacturing the display device 10, the efficiency of the manufacturing process may be increased.

Hereinafter, various embodiments of the display device 10 will be described with reference to other drawings.

Figure 24:
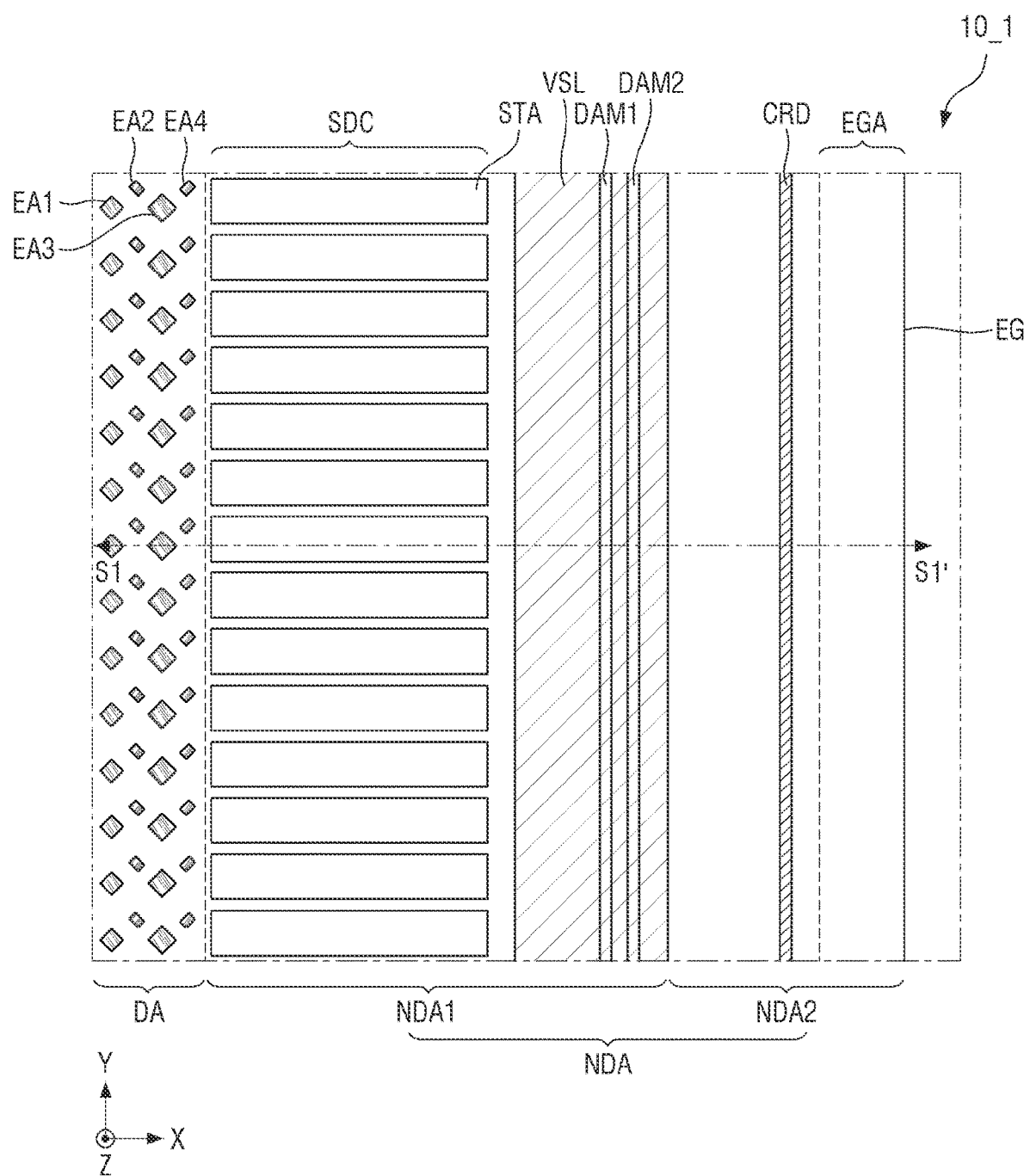
FIG. 24 is a layout diagram illustrating an enlarged partial area of a display panel according to some embodiments.
Figure 25:
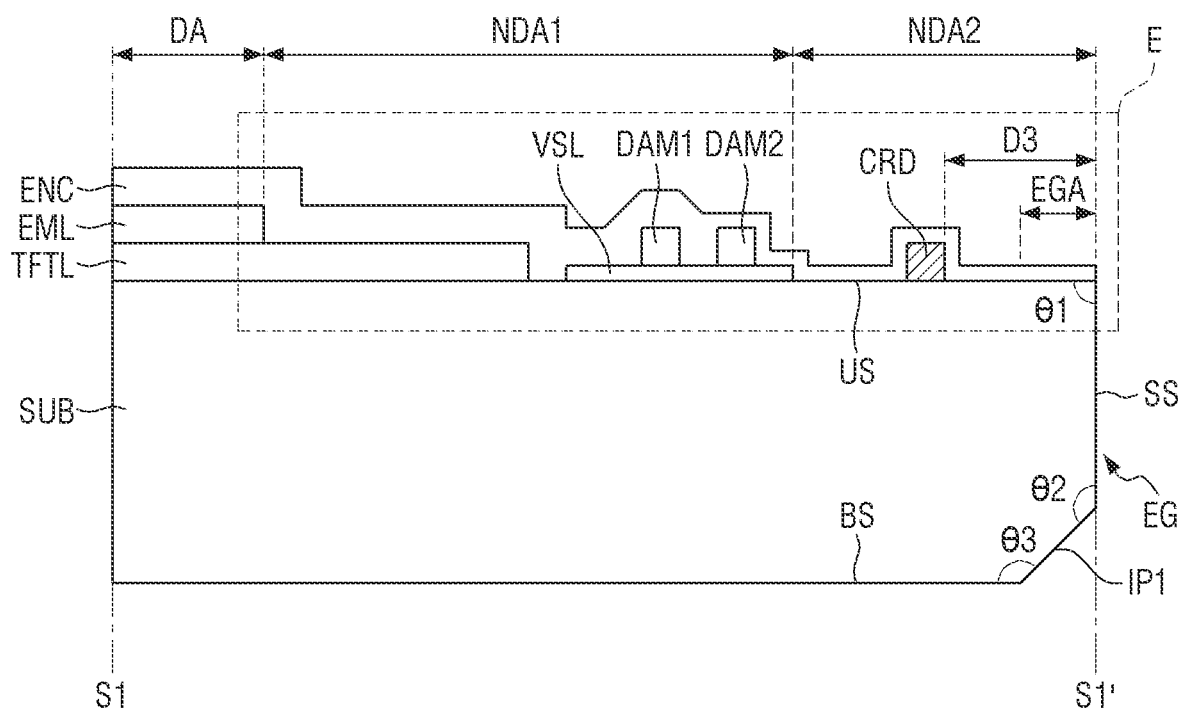
FIG. 25 is a cross-sectional view illustrating an example of a display panel taken along the line S1-S1' of FIG. 24.
Figure 26:
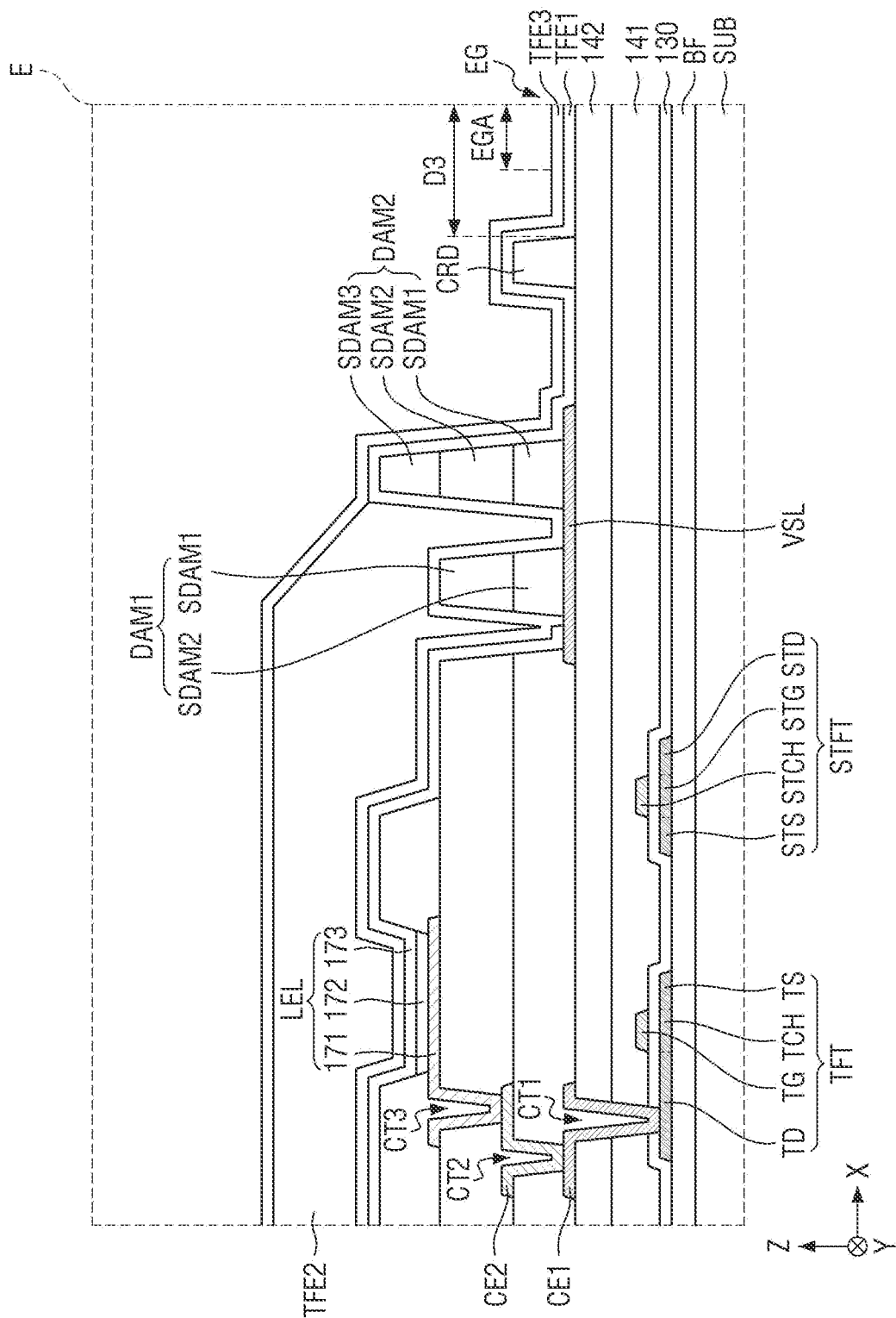
FIG. 26 is a cross-sectional view illustrating area E of FIG. 25 in more detail.

FIG. 24 is a layout diagram illustrating an enlarged partial area of a display panel according to some embodiments. FIG. 25 is a cross-sectional view illustrating an example of a display panel taken along the line S1-S1' of FIG. 24 according to some embodiments. FIG. 26 is a cross-sectional view illustrating area E of FIG. 25 in more detail.

Referring to FIGS. 24 to 26, a display device 10_1 according to some embodiments may further include the crack dam CRD located at an outer part of the display panel 100.

The crack dam CRD may be a structure for preventing or reducing instances of cracks occurring in the process of cutting the substrate SUB during the manufacturing process of the display device 10. The crack dam CRD may be the outermost structure located on the outermost side of the display panel 100. The crack dam CRD may be arranged to surround the second dam DAM2 at the outermost area of the display panel 100. For example, the crack dam CRD may be extended in the second direction (Y-axis direction) in the non-display area NDA on the left side of the display panel 100. The crack dam CRD may be located closer to the edge EG than the second dam DAM2 in the second non-display area NDA2 and may be located between the second dam DAM2 and the edge area EGA.

The crack dam CRD may include the same material as the first organic layer 160 and may be located on the same layer. The crack dam CRD may be located on the second interlayer insulating layer 142. The crack dam CRD may be formed of an organic film such as acryl resin, epoxy resin, phenolic resin, polyamide resin, polyimide resin, etc. According to some embodiments, the width of the crack dam CRD may be approximately 30 μm or less.

FIG. 25 illustrates that the crack dam CRD includes one organic layer, but is not limited thereto. For example, the crack dam CRD may further include another organic layer including the same material as the second organic layer 180. Alternatively, the crack dam CRD may further include another organic layer including the same material as the bank 190. Alternatively, the crack dam CRD may further include another organic layer including the same material as the spacer 191.

Along with the arrangement of the crack dam CRD, the arrangement of the encapsulating layer ENC may also be modified differently from the above-described embodiments. For example, the first encapsulating inorganic layer TFE1 may cover the first dam DAM1, the second dam DAM2, and the crack dam CRD in the non-display area NDA on the left side of the display panel 100. The first encapsulating inorganic layer TFE1 may be extended from the non-display area NDA under the display panel 100 to the edge EG of the display panel 100.

The encapsulating organic layer TFE2 may be arranged to cover the top surface of the first dam DAM1 and not to cover the top surface of the second dam DAM2. However, embodiments according to the present disclosure are not limited thereto. The encapsulating organic layer TFE2 may not cover both the top surface of the first dam DAM1 and the top surface of the second dam DAM2. The encapsulating organic layer TFE2 may not overflow to the edge EG of the display panel 100 due to the first dam DAM1 and the second dam DAM2.

The second encapsulating inorganic layer TFE3 may cover the first dam DAM1, the second dam DAM2, and the crack dam CRD in the non-display area NDA on the left side of the display panel 100. The second encapsulating inorganic layer TFE3 may be extended from the non-display area NDA on the left side of the display panel 100 to the edge EG of the display panel 100.

The inorganic encapsulating area in which the first encapsulating inorganic layer TFE1 and the second encapsulating inorganic layer TFE3 contact each other may be formed from the second dam DAM2 to the edge EG of the display panel 100. The inorganic encapsulating area may be arranged to surround the second dam DAM2. The display panel 100 further includes the crack dam CRD having an encapsulating layer ENC extending to the edge EG and located at the outer part, so that reliability may be secured in an area in which the inorganic layer is directly located on the substrate SUB in the display panel 100.

In addition, FIG. 26 illustrates the scan thin film transistor STFT of the scan driving circuit unit SDC. Because the scan thin film transistor STFT is substantially the same as the thin film transistor TFT described with reference to FIG. 6, a description of the scan thin film transistor STFT will be omitted.

As the encapsulating layer ENC extends to the edge EG of the display panel 100, a distance D3 between the crack dam CRD and the edge EG or a distance between the crack dam CRD and the edge area EGA may be defined in the display panel 100. According to some embodiments, the distance D2 between the crack dam CRD and the edge EG is 130 μm or less, and the distance between the crack dam CRD and the edge region EGA is about 80 μm or less in the display panel 100.

When the substrate SUB is cut by spraying the etchant after laser irradiation, the minimum distance from the display pad PD to the edge of the substrate SUB may vary depending on the one-side tolerance of the laser. In this case, the minimum distance D3 from the crack dam CRD, which is the outermost structure, to the edge EG of the display panel 100 may be the sum of the width of the edge area EGA, the minimum distance from the crack dam CRD to the edge area EGA, and the unilateral tolerance of the laser. For example, if the minimum distance between the crack dam CRD and the edge area EGA is designed to be approximately 30 μm or less, the minimum distance between the crack dam CRD and the edge area EGA may be at most 80 μm or less due to the tolerance of 50 μm on one side of the laser. However, the minimum distance between the crack dam CRD and the edge area EGA may be 0 μm.

Similarly, when the minimum distance between the crack dam CRD and the edge area EGA is designed to be approximately 30 μm or less and the width of the edge area EGA is designed to be around 50 μm, the minimum distance D3 between the crack dam CRD and the edge EG may be at most 130 μm or less due to the tolerance of 50 μm on one side of the laser.

Similar to the distance D1 between the encapsulating layer ENC and the edge EG of the display panel 100, the minimum distance from the crack dam CRD, which is the outermost structure, to the edge EG of the display panel 100 may vary depending on the width of the edge area EGA and the minimum distance from the crack dam CRD to the edge area EGA.

When the substrate SUB is cut by spraying the etchant after laser irradiation, the minimum distance from the display pad PD to the edge of the substrate SUB may vary depending on the one-side tolerance of the laser. For example, when the laser unilateral tolerance is 50 μm, the distance D2 between the crack dam CRD and the edge EG may be 0 μm or less at the minimum or 130 μm or less at the maximum.

Figure 27:
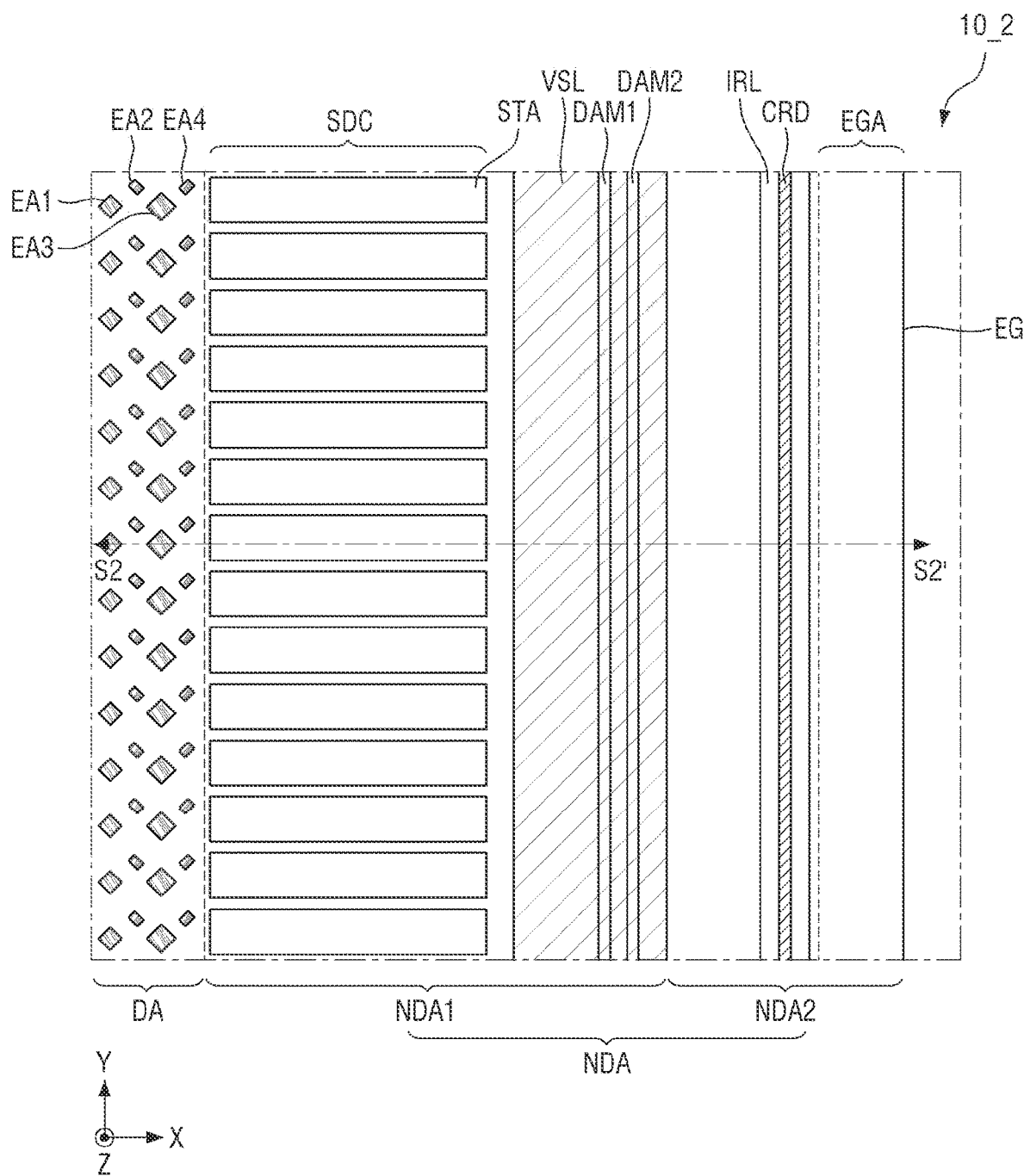
FIG. 27 is a layout diagram illustrating an enlarged partial area of a display panel according to some embodiments.
Figure 28:
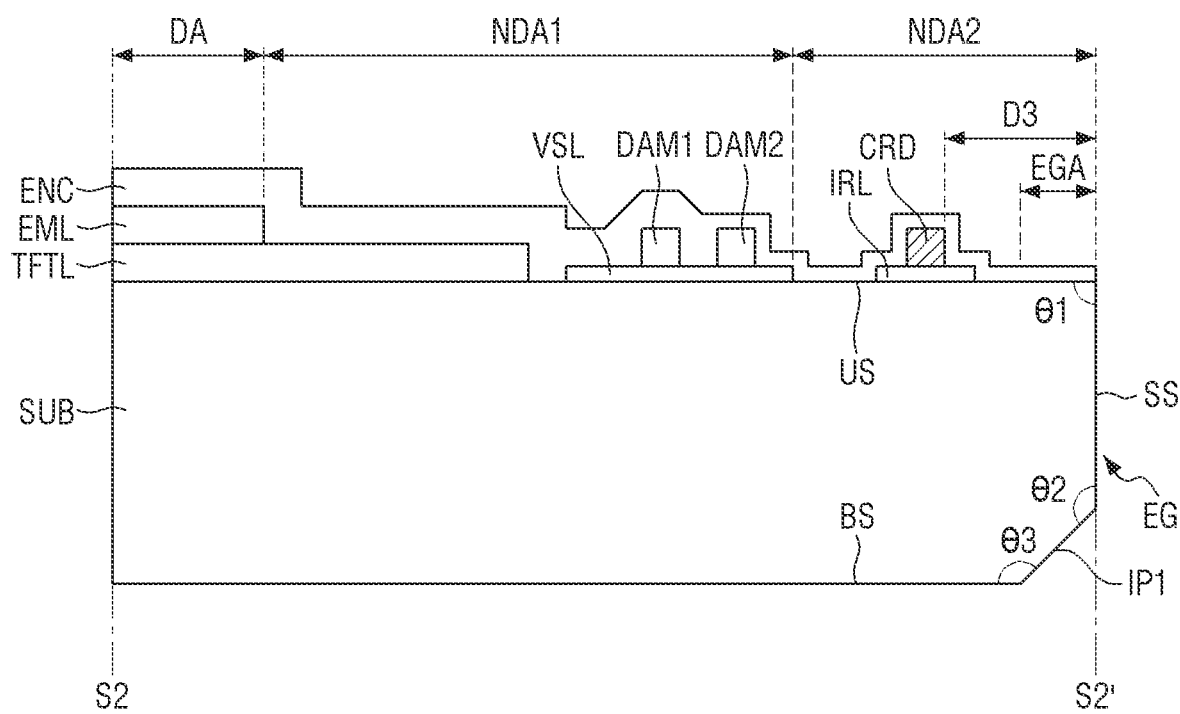
FIG. 28 is a cross-sectional view illustrating an example of a display panel taken along the line S2-S2' of FIG. 27 according to some embodiments.

FIG. 27 is a layout diagram illustrating an enlarged partial area of a display panel according to some embodiments. FIG. 28 is a cross-sectional view illustrating an example of a display panel taken along the line S2-S2' of FIG. 27 according to some embodiments.

Referring to FIGS. 27 and 28, a display device 10_2 according to some embodiments may further include a heat dissipation layer IRL arranged to overlap the crack dam CRD. The heat dissipation layer IRL may be located on the outer part of the display panel 100 and located inside the edge area EGA to overlap the crack dam CRD.

The heat dissipation layer IRL dissipates heat generated by the laser irradiated to the cutting process of the mother substrate MSUB in the manufacturing process of the display device 10 or may minimize or reduce the effect of the laser on the display panel 100 in the cutting process by increasing the infrared absorption rate. For example, the heat dissipation layer IRL may include a metal material having high thermal conductivity or a material having high infrared absorption. The heat dissipation layer IRL may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The width of the heat dissipation layer may be greater than the width of the edge area EGA. For example, the width of the heat dissipation layer may be 50 μm or more and 300 μm or less. However, the present disclosure is not limited thereto.

Figure 29:
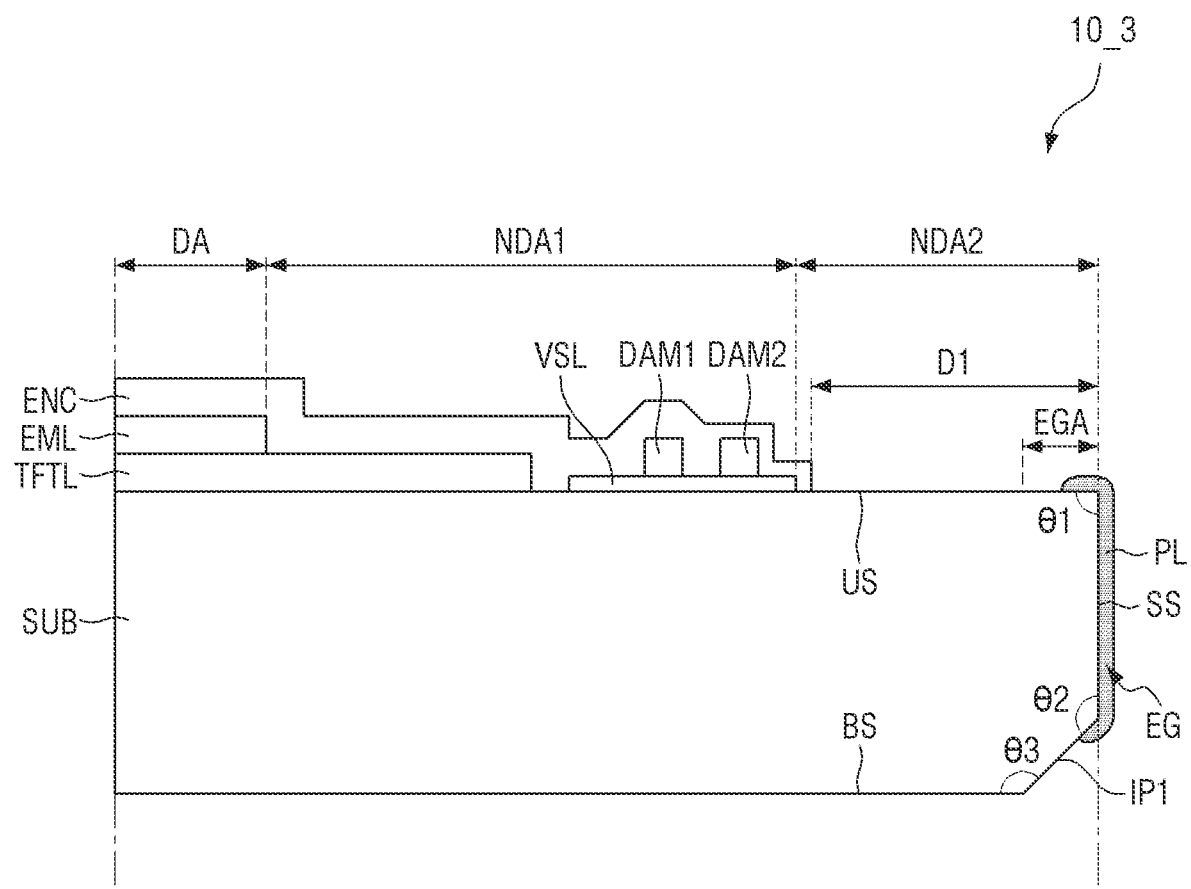
FIG. 29 is a cross-sectional view illustrating a partial area of a display panel according to some embodiments.

FIG. 29 is a cross-sectional view illustrating a partial area of a display panel according to some embodiments.

Referring to FIG. 29, a display device 10_3 according to some embodiments may further include a protective layer PL located on the edge EG of the display panel 100. The protective layer PL may be arranged to cover a portion of the side surface SS and the upper surface US, and a portion of the first inclined surface IP1 of the substrate SUB of the display panel 100. The protective layer PL overlaps the edge area EGA and may partially cover the processing marks formed on the upper surface US of the substrate SUB.

As described above, in the manufacturing process of the display device 10_3, a process of separating the substrate SUB from the mother substrate MSUB may be performed through a laser irradiation process and the etching process. Accordingly, the edge area EGA in which the processing mark is left may be formed on the substrate SUB of the display panel 100, and the first inclined surface IP1 having the bottom surface or a portion of the side inclined may be formed. Because the structural shape of the display panel 100 may be relatively vulnerable to external impact, the display device 10_3 may further include the protective layer PL located on the end surface of the display panel 100 substrate SUB to protect this.

When the substrate SUB is separated from the mother substrate MSUB in the manufacturing process of the display device 10_3, the protective layer PL may be located on a cross section cut by performing the laser irradiation process and the etching process. In the drawings, it is illustrated that the protective layer PL is arranged to cover a portion of the side surface SS and the upper surface US and a portion of the first inclined surface IP1 of the substrate SUB of the display panel 100 but is not limited thereto. According to some embodiments, the protective layer PL may completely cover the side surface SS and the first inclined surface IP1 of the substrate SUB of the display panel 100, and another protective layer PL may be further located on the bottom surface of the substrate SUB.

In concluding the detailed description, those skilled in the art will appreciate that many variations and modifications can be made to the example embodiments without substantially departing from the spirit and scope of embodiments according to the present invention. Therefore, the disclosed example embodiments of the invention are used in a generic and descriptive sense only and not for purposes of limitation.

What is claimed is:

1. A display device comprising:
a substrate including a display area and a non-display area surrounding the display area;
a light emitting element layer on the display area on the substrate and including a plurality of light emitting elements; and
an encapsulating layer on the light emitting element layer and on a portion of the display area and the non-display area; and
wherein the substrate comprises an upper surface on which the light emitting element layer is located, a bottom surface opposite to the upper surface, a side surface connected to the upper surface and not parallel to the upper surface, and a first inclined surface connected to the side surface and the bottom surface and not parallel to the side surface and the bottom surface,
wherein a processing trace remains at an edge area of the upper surface of the substrate adjacent to an edge of the substrate, and a width of the processing trace in a plan view is less than a width of the first inclined surface in the plan view.

2. The display device of claim 1, wherein the encapsulating layer comprises a first encapsulating inorganic layer, an encapsulating organic layer on the first encapsulating inorganic layer, and a second encapsulating inorganic layer on the encapsulating organic layer,
wherein at least a portion of the first encapsulating inorganic layer and the second encapsulating inorganic layer is in the non-display area.

3. The display device of claim 2, further comprising a crack dam in the non-display area on the substrate and surrounding the display area.

4. The display device of claim 3, further comprising a heat dissipation layer on the substrate overlapping the crack dam.

5. The display device of claim 4, wherein the heat dissipation layer is formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

6. The display device of claim 3, wherein the first encapsulating inorganic layer and the second encapsulating inorganic layer of the encapsulating layer cover the crack dam and extend to the edge area of the substrate.

7. The display device of claim 3, wherein a distance between the crack dam and the edge area is 130 µm or less.

8. The display device of claim 1, further comprising a first dam in the non-display area and surrounding the light emitting element layer;
a second dam surrounding the first dam and closer to an edge of the substrate than the first dam,
wherein the encapsulating layer covers the first dam.

9. The display device of claim 8, wherein at least a portion of the encapsulating layer covers the second dam.

10. The display device of claim 8, wherein the encapsulating layer covers the second dam so that a portion thereof is between the second dam and the edge of the substrate, and
wherein a distance between the edge of the substrate and the encapsulating layer is 300 µm or less.

11. The display device of claim 1, wherein a width of the edge area is 50 µm.

12. The display device of claim 1, wherein the first inclined surface overlaps the edge area in a thickness direction.

13. The display device of claim 1 further comprising a protective layer on the side surface of the substrate and the first inclined surface.

14. The display device of claim 1, wherein an angle between the upper surface and the side surface of the substrate is 90°, and
an angle formed between the side surface and the first inclined surface, and an angle formed between the first inclined surface and the bottom surface are obtuse angles, respectively.

* * * * *